(12) United States Patent
Yoo et al.

(10) Patent No.: US 12,419,185 B2
(45) Date of Patent: Sep. 16, 2025

(54) DISPLAY DEVICE INCLUDING A LIGHT BLOCKING LAYER

(71) Applicant: Samsung Display Co., LTD., Yongin-si (KR)

(72) Inventors: Gi Na Yoo, Yongin-si (KR); Ju Yeon Kim, Yongin-si (KR); Won Sang Park, Yongin-si (KR); Chang Woo Shim, Yongin-si (KR); Seong Jun Lee, Yongin-si (KR); Dong Hee Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 447 days.

(21) Appl. No.: 18/091,447

(22) Filed: Dec. 30, 2022

(65) Prior Publication Data
US 2023/0354681 A1    Nov. 2, 2023

(30) Foreign Application Priority Data
Apr. 27, 2022    (KR) .................. 10-2022-0051907

(51) Int. Cl.
| | |
|---|---|
| *H10K 59/80* | (2023.01) |
| *H05K 5/02* | (2006.01) |
| *H10K 59/12* | (2023.01) |
| *H10K 59/38* | (2023.01) |
| *H10K 59/40* | (2023.01) |

(52) U.S. Cl.
CPC ....... *H10K 59/8792* (2023.02); *H05K 5/0217* (2013.01); *H10K 59/38* (2023.02); *H10K 59/12* (2023.02); *H10K 59/40* (2023.02)

(58) Field of Classification Search
None
See application file for complete search history.

(56) References Cited

U.S. PATENT DOCUMENTS

| | | | |
|---|---|---|---|
| 2021/0233970 A1* | 7/2021 | Wang | H10K 59/353 |
| 2024/0057380 A1* | 2/2024 | Lv | H10K 59/126 |
| 2024/0155788 A1* | 5/2024 | Huang | H04M 1/0268 |

FOREIGN PATENT DOCUMENTS

| | | |
|---|---|---|
| KR | 10-2017-0040417 | 4/2017 |
| KR | 10-1837714 | 3/2018 |
| KR | 10-1927438 | 12/2018 |
| KR | 10-2021-0130903 | 11/2021 |

* cited by examiner

*Primary Examiner* — Nduka E Ojeh

(57) ABSTRACT

A display device comprises a first display area, a second display area adjacent to a side of the first display area, a third display area adjacent to a side of the second display area, a plurality of emission areas disposed in the first, second, and third display areas to emit light, and a light blocking layer surrounding the plurality of emission areas. A width of the light blocking layer between adjacent emission areas in a first direction in each of the first and third display areas is greater than a width of the light blocking layer between adjacent emission areas in the first direction in the second display area.

20 Claims, 17 Drawing Sheets

DISPLAY DEVICE INCLUDING A LIGHT BLOCKING LAYER

CROSS REFERENCE TO RELATED APPLICATION(S)

This application claims priority to and the benefits of Korean Patent Application No. 10-2022-0051907 under 35 U.S.C. § 119, filed on Apr. 27, 2022, in the Korean Intellectual Property Office (KIPO), the entire contents of which are incorporated herein by reference.

BACKGROUND

1. Technical Field

Embodiments relate to a display device.

2. Description of the Related Art

As the information society develops, demands for display devices for displaying images have been increased in various forms. For example, display devices have been applied to various electronic devices such as smartphones, digital cameras, notebook computers, navigation devices, and smart televisions. The display devices may be flat panel display devices such as liquid crystal display devices, field emission display devices, and organic light emitting display devices. Among these flat panel display devices, a light emitting display device includes a light emitting element that enables each pixel of a display panel to emit light by itself. Thus, the light emitting display device displays an image without a backlight unit that provides light to the display panel.

Since the light emitting display device is bendable or foldable, the light emitting display device may include a flexible substrate, and may be implemented as a flexible display device such as a foldable display device or a slidable display device.

SUMMARY

Embodiments provide a display device capable of delaying, minimizing, or preventing the occurrence of an afterimage between display areas according to a difference in driving time between the display areas.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment, a display device may include a first display area, a second display area adjacent to a side of the first display area, a third display area adjacent to a side of the second display area, a plurality of emission areas disposed in the first, second, and third display areas to emit light, and a light blocking layer surrounding the plurality of emission areas in plan view. A width of the light blocking layer between adjacent emission areas in a first direction in each of the first and third display areas is greater than a width of the light blocking layer between adjacent emission areas in the first direction in the second display area.

The plurality of emission areas may include first emission areas that emit light of a first color, second emission areas that emit light of a second color different from the first color, and third emission areas that emit light of a third color different from the first and second colors.

The light blocking layer between the adjacent second emission areas in the first direction in the first and third display areas may have a first width. The light blocking layer between the adjacent second emission areas in the first direction in the second display area may have a second width. The first width may be greater than the second width.

The light blocking layer between the first and third emission areas adjacent to each other in the first direction in the first and third display areas may have a third width. The light blocking layer between the first and third emission areas adjacent to each other in the first direction in the second display area may have a fourth width. The third width may be greater than the fourth width.

Each of the first, second, and third emission areas and the light blocking layer may be spaced apart from each other by a first distance in the first and third display areas. Each of the first, second, and third emission areas and the light blocking layer may be spaced apart from each other by a second distance in the second display area. The second distance may be greater than the first distance.

Each of the second emission areas and the light blocking layer may be spaced apart from each other by a first distance in the first and third display areas. Each of the second emission areas and the light blocking layer may be spaced apart from each other by a second distance in the second display area. The second distance may be greater than the first distance.

Each of the first emission areas and the light blocking layer may be spaced apart from each other by a third distance in the first and third display areas. Each of the first emission areas and the light blocking layer may be spaced apart from each other by a fourth distance in the second display area. The fourth distance may be greater than the third distance.

Each of the third emission areas and the light blocking layer may be spaced apart from each other by a fifth distance in the first and third display areas. Each of the third emission areas and the light blocking layer may be spaced apart from each other by a sixth distance in the second display area. The sixth distance is greater than the fifth distance.

The display device may further include a plurality of color filters overlapping the plurality of emission areas and surrounded by the light blocking layer.

A first height of each of the color filters of the first and third display areas may be greater than a second height of each of the color filters of the second display area.

The second display area may include a second-first display area adjacent to a side of the first display area, and a second-second display area disposed between the second-first display area and the third display area.

A width of the light blocking layer between adjacent emission areas in the first direction in each of the first and third display areas may be greater than a width of the light blocking layer between adjacent emission areas in the first direction in the second-first display area.

The display device may further include a plurality of color filters overlapping the plurality of emission areas and surrounded by the light blocking layer. A height of each of the color filters of the first and third display areas may be greater than a height of each of the color filters of the second-first display area.

The width of the light blocking layer between the adjacent emission areas in the first direction in the second-first display area may be greater than a width of the light blocking layer between adjacent emission areas in the first direction in the second-second display area.

The display device may further include a plurality of color filters overlapping the plurality of emission areas and surrounded by the light blocking layer. A height of each of the color filters of the second-first display area may be greater than a height of each of the color filters of the second-second display area.

The third display area may overlap the first and second display areas in the first state. The first, second, and third display areas may form the same plane in the second state. The first and second display areas may be driven in the first state and the second state, and the third display area may be driven in the second state.

According to an embodiment, a display device may include a first display area, a second display area adjacent to a side of the first display area, a third display area adjacent to a side of the second display area, a fourth display area disposed between the second and third display areas, a plurality of emission areas disposed in the first, second, third, and fourth display areas to emit light, and a light blocking layer surrounding the plurality of emission areas in plan view. The light blocking layer between adjacent emission areas in a first direction in the first and third display areas has a first width. The light blocking layer between adjacent emission areas in the first direction in the second display area has a second width. The light blocking layer between adjacent emission areas in the first direction in the fourth display area has a third width. The first width is greater than the second width, and the third width is greater than the first width.

The plurality of emission areas may include first emission areas that emit light of a first color, second emission areas that emit light of a second color different from the first color, and third emission areas that emit light of a third color different from the first and second colors. Each of the first, second, and third emission areas and the light blocking layer may be spaced apart from each other by a first distance in the first display area. Each of the first, second, and third emission areas and the light blocking layer may be spaced apart from each other by a second distance in the second display area. The second distance may be greater than the first distance.

Each of the first, second, and third emission areas and the light blocking layer may be spaced apart from each other by the first distance in the first and third display areas. Each of the first, second, and third emission areas and the light blocking layer may be spaced apart from each other by a third distance in the fourth display area. The first distance may be greater than the third distance.

According to an embodiment, a display device may include a first display area, a second display area adjacent to a side of the first display area, a third display area adjacent to a side of the second display area, a roller that selectively moves the third display area by sliding the third display area, a plurality of emission areas disposed in the first, second, and third display areas to emit light, and a light blocking layer surrounding the plurality of emission areas in plan view. The roller moves the third display area in a first direction in a first state so that the third display area overlaps the first and second display areas. The third display area may be moved in a second direction opposite to the first direction in a second state by the roller so that the first, second, and third display areas may form the same plane. A width of the light blocking layer between adjacent emission areas in the first direction in each of the first and third display areas is greater than a width of the light blocking layer between adjacent emission areas in the first direction in the second display area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
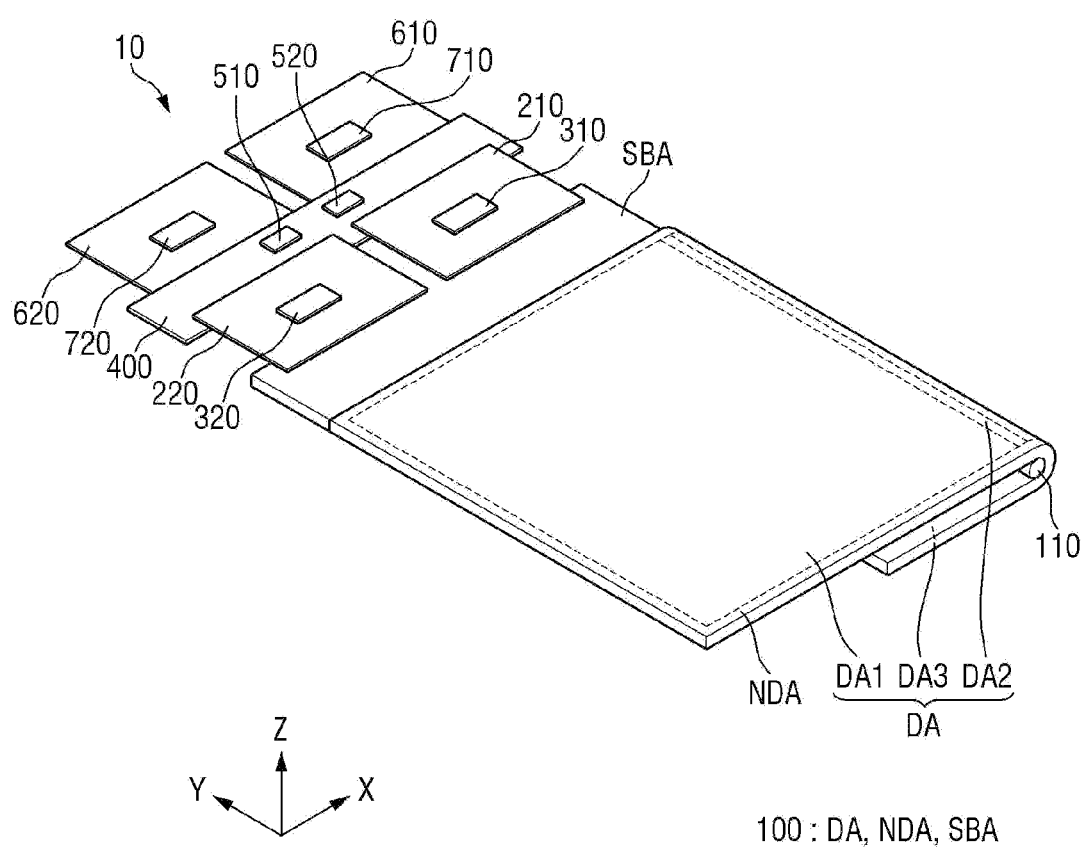
FIG. 1 is a schematic perspective view illustrating a first state of a display device according to an embodiment.

In the following description, for the purposes of explanation, numerous specific details are set forth in order to provide a thorough understanding of various embodiments or implementations. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. In case that an embodiment may be implemented differently, a specific process order may be performed differently from the described order. For example, two consecutively described processes may be performed substantially at the same time or performed in an order opposite to the described order. Also, like reference numerals denote like elements.

In case that an element, such as a layer, is referred to as being "on," "connected to," or "coupled to" another element or layer, it may be directly on, connected to, or coupled to the other element or layer or intervening elements or layers may be present. In case that, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise.

Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

Figure 2:
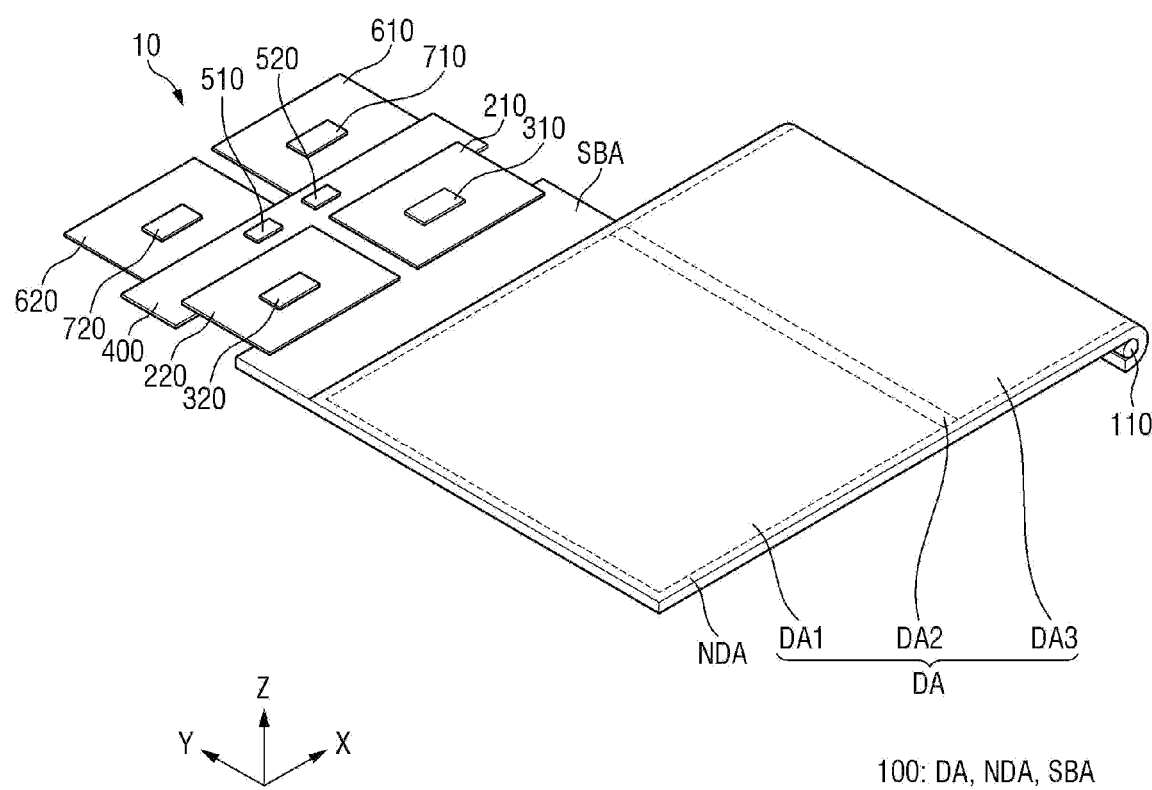
FIG. 2 is a schematic perspective view illustrating a second state of the display device according to an embodiment.
Figure 3:
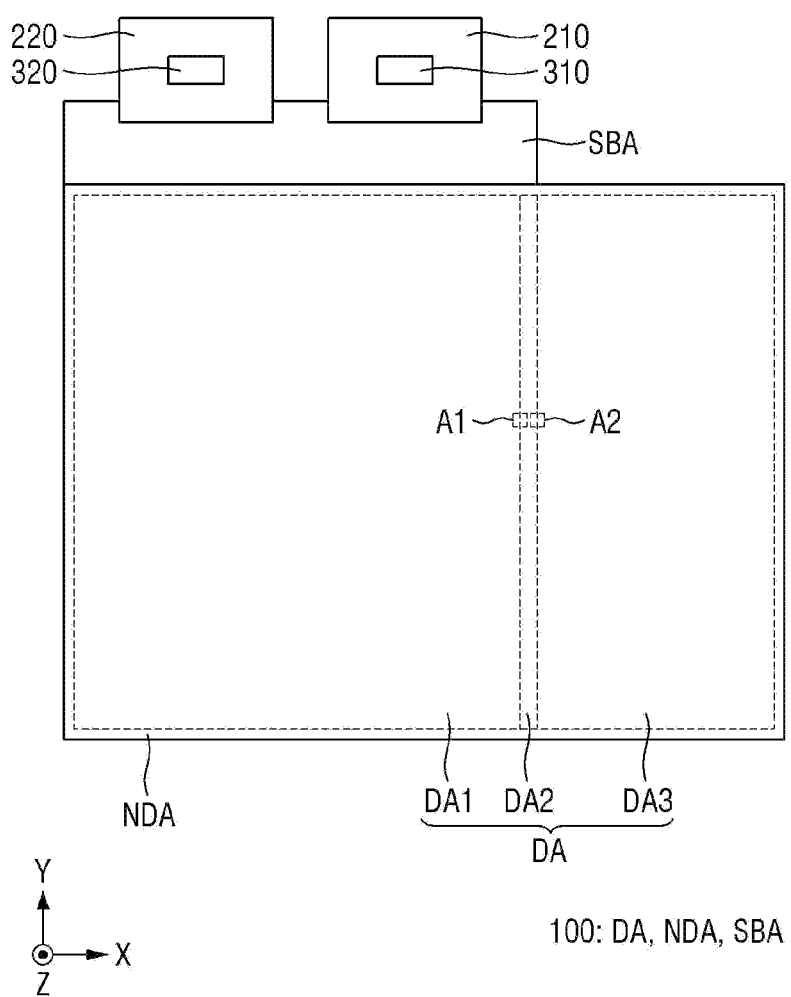
FIG. 3 is a schematic plan view of the display device according to an embodiment.

FIG. 1 is a schematic perspective view illustrating a first state of a display device 10 according to an embodiment. FIG. 2 is a schematic perspective view illustrating a second state of the display device 10 according to an embodiment. FIG. 3 is a schematic plan view of the display device 10 according to an embodiment.

Referring to FIGS. 1 through 3, the display device 10 may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). For example, the display device 10 as a display unit may be applied to a television, a notebook computer, a monitor, a billboard, or an Internet of things (IoT) device. As another example, the display device 10 may be applied to wearable devices such as smart watches, watch phones, glass-like displays, and head-mounted displays (UINMDs).

The display device 10 may include a display panel 100, a first source circuit board 210, a second source circuit board 220, a first display driver 310, a second display driver 320, a control circuit board 400, a timing control circuit 510, a sensor control circuit 520, a first circuit board 610, a second circuit board 620, a first integrated circuit 710, and a second integrated circuit 720.

The display panel 100 may be flexible and may be curved or bent by a roller 110. The display panel 100 may include a display area DA, a non-display area NDA, and a sub-area SBA.

The display area DA may include pixels displaying an image. Each of the pixels may emit light from an emission area or an opening area. For example, the display area DA may include pixel circuits including switching elements, a pixel defining layer defining the emission areas or the opening areas, and self-light emitting elements.

For example, the self-light emitting elements may include at least one of an organic light emitting diode including an organic light emitting layer, a quantum dot light emitting diode including a quantum dot light emitting layer, an inorganic light emitting diode including an inorganic semiconductor, and an ultra-small light emitting diode (a micro light emitting diode or a nano light emitting diode). However, embodiments are not limited thereto.

The display area DA may include a first display area DA1, a second display area DA2, and a third display area DA3.

The first and second display areas DA1 and DA2 may be a main display unit of the display panel 100. The first and second display areas DA1 and DA2 may be driven in the first state and the second state of the display device 10. The second display area DA2 may be disposed on a right side of the first display area DAL. The second display area DA2 may extend in a first direction (e.g., X-axis direction) from the first display area DAL. The second display area DA2 may be disposed between the first and third display areas DA1 and DA3. A length of the second display area DA2 in the first direction (e.g., X-axis direction) may be significantly smaller than a length of the first or third display area DA1 or DA3 in the first direction (e.g., X-axis direction). The first and second display areas DA1 and DA2 may be flat areas that are not curved or bent. For example, the second display area DA2 may be a boundary area between the first display area DA1 as a flat area and the third display area DA3 as a rollable or bendable area. However, embodiments are not limited thereto. The first and second display areas DA1 and DA2 may have a quadrilateral planar shape. However, embodiments are not limited thereto.

The third display area DA3 may be disposed on a right side of the second display area DA2. The third display area DA3 may extend in the first direction (e.g., X-axis direction) from the second display area DA2 in the second state of the display device 10. The third display area DA3 may be an auxiliary display unit of the display panel 100. The third display area DA3 may not be driven in the first state of the display device 10 and may be driven in the second state of the display device 10. In the second state of the display device 10, the first, second, and third display areas DA1, DA2, and DA3 may form the same plane and may display one image together. The third display area DA3 may be curved or bent along the roller 110.

The sub-area SBA may be disposed on (or adjacent to) a side of each of the first and second display areas DA1 and DA2. The sub-area SBA may extend in a second direction (e.g., Y-axis direction) from the first and second display areas DA1 and DA2. The sub-area SBA may be an area that is curved or bent. In case that the sub-area SBA is bent, it may overlap the first and second display areas DA1 and DA2 in a third direction (e.g., Z-axis direction). The sub-area SBA may have a quadrilateral planar shape. However, embodiments are not limited thereto.

The first source circuit board 210 and the second source circuit board 220 may be attached (or connected) to an upper edge of the sub-area SBA. Each of the first and second source circuit boards 210 and 220 may be attached (or connected) onto a pad portion disposed at the upper edge of the sub-area SBA by using an anisotropic conductive film (ACF). Accordingly, each of the first and second source circuit boards 210 and 220 may be connected (e.g., electrically connected) to the pad portion of the display panel 100. Each of the first and second source circuit boards 210 and 220 may be a flexible printed circuit board, a printed circuit board, or a flexible film such as a chip on film.

The first display driver 310 and the second display driver 320 may supply data voltages to data lines of the display panel 100. For example, the first display driver 310 may be connected (e.g., electrically connected) to the data lines of the display panel 100 through the first source circuit board 210 and the pad portion of the sub-area SBA. The second display driver 320 may be connected (e.g., electrically connected) to the data lines of the display panel 100 through the second source circuit board 220 and the pad portion of the sub-area SBA. Each of the first and second display drivers 310 and 320 may be formed as an integrated circuit. The first display driver 310 may be attached (or connected) to a surface of the first source circuit board 210 by using a chip on film (COF) method. The second display driver 320 may be attached (or connected) to a surface of the second source circuit board 220 by using the COF method.

The control circuit board 400 may be connected (e.g., electrically connected) to the first and second source circuit boards 210 and 220. The control circuit board 400 may be attached (or connected) to the first and second source circuit boards 210 and 220 by using an anisotropic conductive film. The control circuit board 400 may be a printed circuit board.

The timing control circuit 510 may be attached (or connected) to a surface of the control circuit board 400. The timing control circuit 510 may be formed as an integrated circuit. The timing control circuit 510 may transmit digital video data to the first and second display drivers 310 and 320 to control driving timings of the first and second display drivers 310 and 320. For example, the timing control circuit 510 may transmit first digital video data and a first timing control signal to the first display driver 310 and transmit second digital video data and a second timing control signal to the second display driver 320. The timing control circuit 510 may be connected (e.g., electrically connected) to a power line of the display panel 100 through the first or second source circuit board 210 or 220 and the pad portion of the sub-area SBA.

The sensor control circuit 520 may be attached (or connected) to the surface of the control circuit board 400. The sensor control circuit 520 may be formed as an integrated circuit. The sensor control circuit 520 may be connected (e.g., electrically connected) to sensor electrodes through the control circuit board 400, the first source circuit board 210, the second source circuit board 220, and sensor lines of the display panel 100. The sensor control circuit 520 may supply a sensor driving signal to the sensor electrodes and sense a change in capacitance of each of the sensor electrodes. The sensor control circuit 520 may determine whether a user's touch or proximity has occurred based on the amount of change in capacitance of each of the sensor electrodes. The user's touch means that an object such as the user's finger or a pen directly touches a surface of the display panel 100. The user's proximity means that an object such as the user's finger or a pen hovers above the surface of the display panel 100.

The first circuit board 610 and the second circuit board 620 may be connected (e.g., electrically connected) to the control circuit board 400. Each of the first and second circuit boards 610 and 620 may be attached (or connected) to the control circuit board 400 by using an anisotropic conductive film. Each of the first and second circuit boards 610 and 620 may be a flexible printed circuit board, a printed circuit board, or a flexible film such as a chip on film.

The first integrated circuit 710 may be attached (or connected) to a surface of the first circuit board 610 by using the COF method. The second integrated circuit 720 may be attached (or connected) to a surface of the second circuit board 620 by using the COF method. Each of the first and second integrated circuits 710 and 720 may be connected (e.g., electrically connected) to the timing control circuit 510. At least any one of the first and second integrated circuits 710 and 720 may transmit digital video data to the timing control circuit 510.

The roller 110 may extend in the second direction (e.g., Y-axis direction). The roller 110 may move in the first direction (e.g., X-axis direction). The roller 110 may have a rotation axis in the second direction (e.g., Y-axis direction) and may rotate in a first rotation direction or a second rotation direction. For example, the first rotation direction may be a clockwise direction, and the second rotation direction may be a counterclockwise direction. Therefore, the roller 110 may move in the first direction (e.g., X-axis direction) with rotating in the first or second rotation direction.

In case that the roller 110 rotates in the second rotation direction with moving to the right, the third display area DA3 may be gradually exposed to the front (or gradually extended). As the roller 110 moves to the right, the area of the third display area DA3 viewed from the front of the display device 10 may increase.

In case that the roller 110 rotates in the first rotation direction with moving to the left, the third display area DA3 may gradually face the back side. As the roller 110 moves to the left, the area of the third display area DA3 viewed from the front of the display device 10 may decrease.

Since the third display area DA3 slides according to the movement of the roller 110, the size of the display panel 100 viewed from the front of the display device 10, e.g., the size of the display area DA in which an image is displayed may be adjusted. Therefore, a user may select the size of the display panel 100 by adjusting the display device 10 to the first state or the second state according to the usage of the display device 10.

Figure 4:
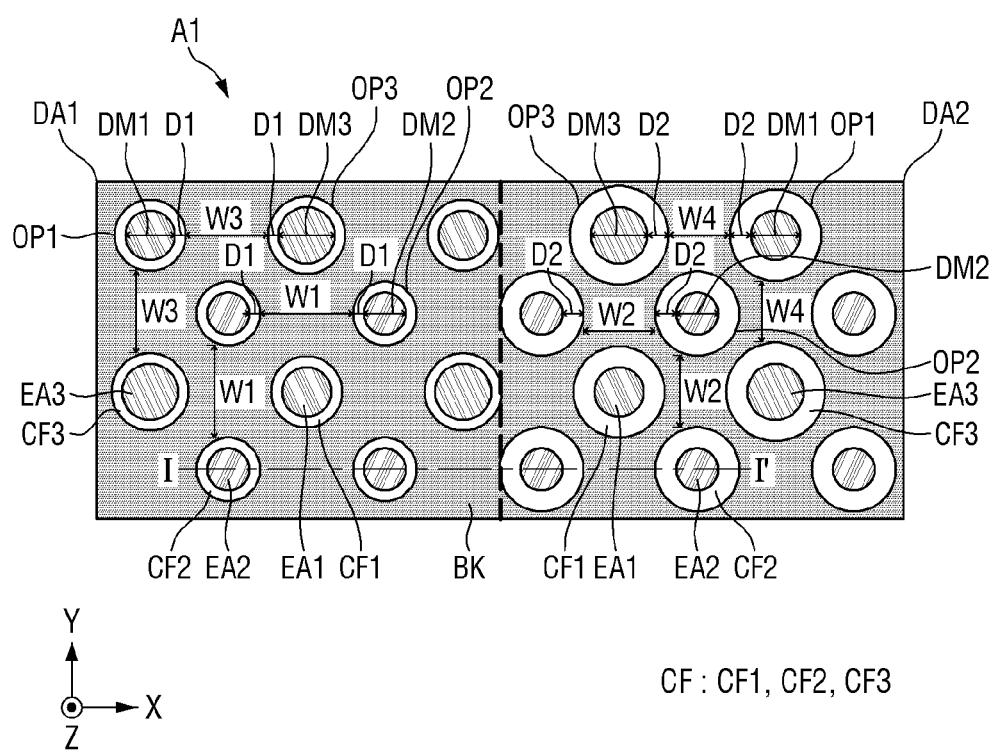
FIG. 4 is a schematic enlarged view of an example of area A1 of FIG. 3.
Figure 5:
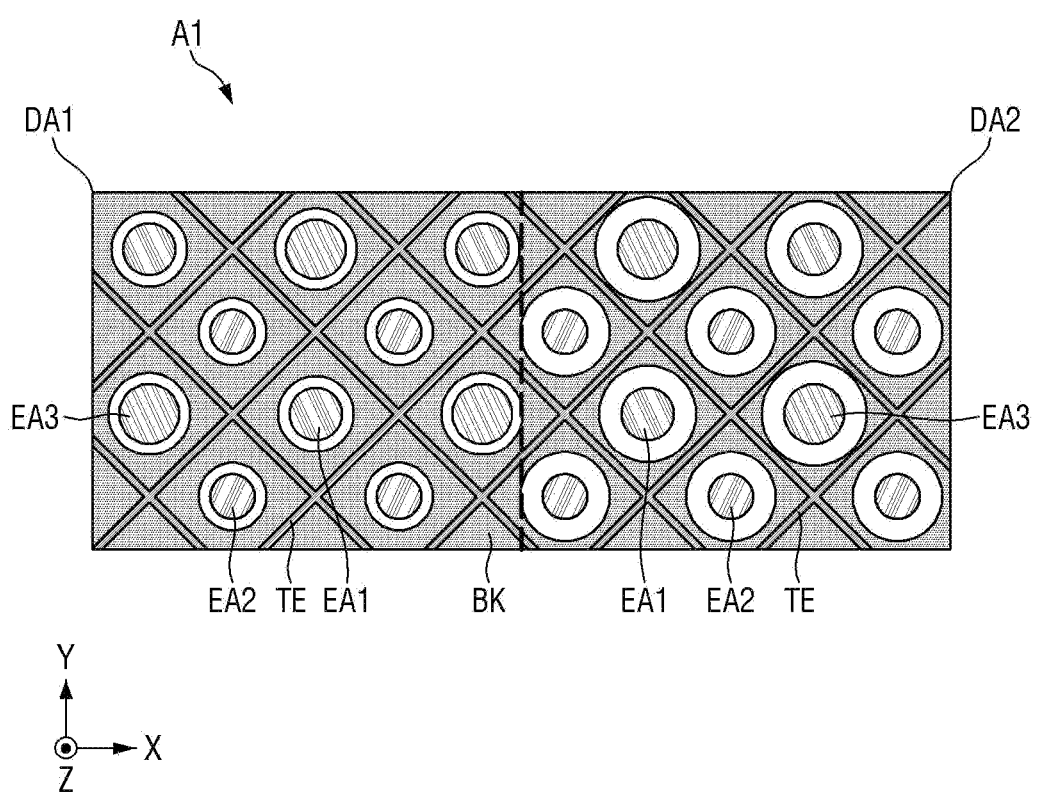
FIG. 5 is a schematic plan view illustrating emission areas and touch electrodes of area A1 of FIG. 3.
Figure 6:
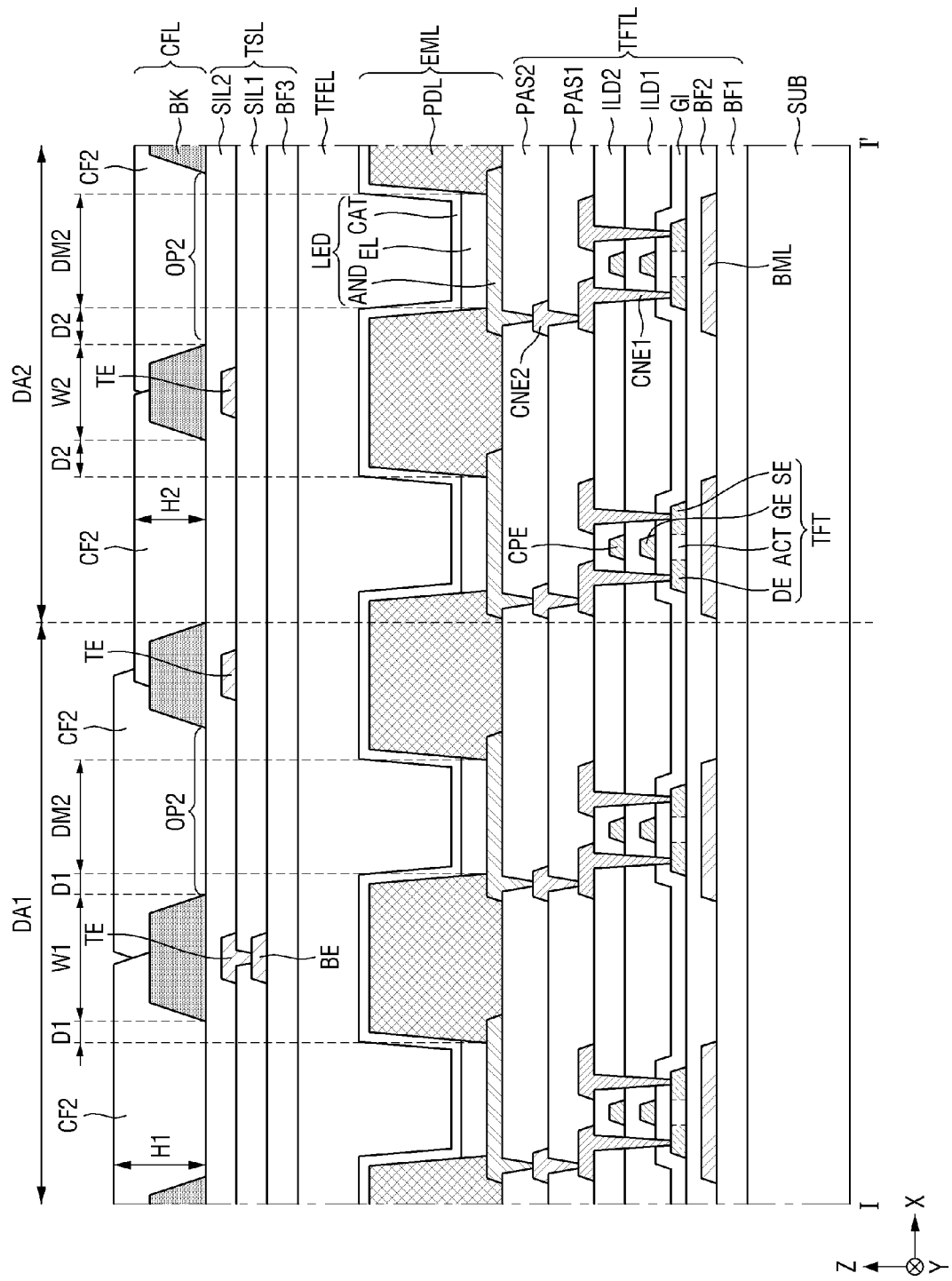
FIG. 6 is a schematic cross-sectional view taken along line I-I' of FIG. 4.
Figure 7:
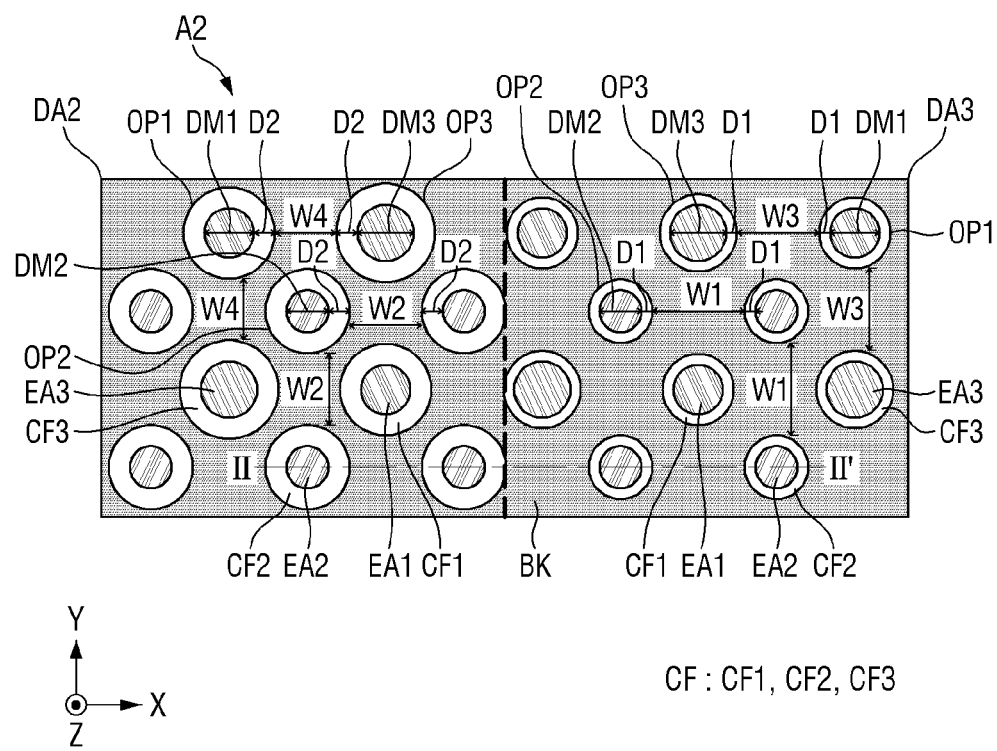
FIG. 7 is a schematic enlarged view of an example of area A2 of FIG. 3.
Figure 8:
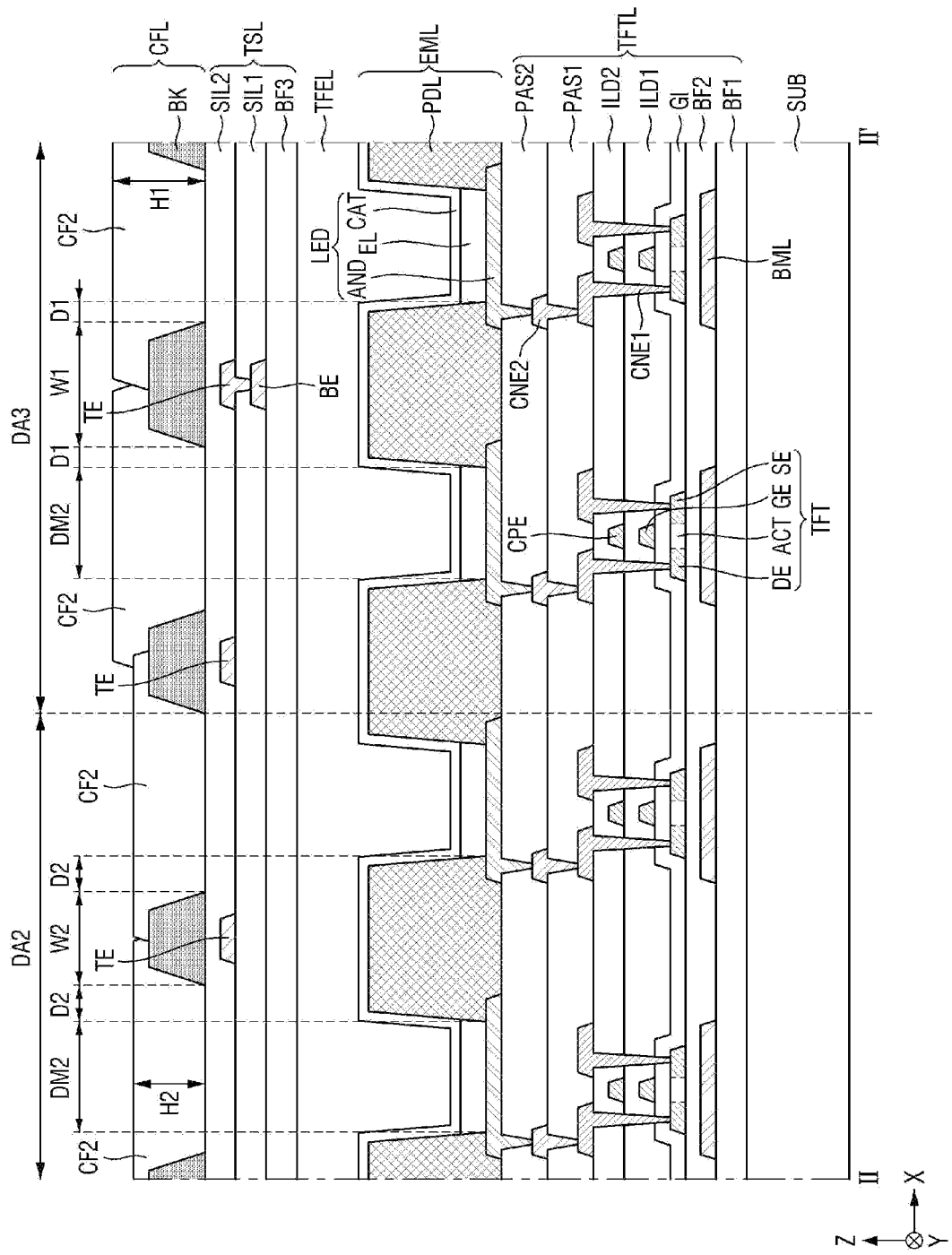
FIG. 8 is a schematic cross-sectional view taken along line II-II' of FIG. 7.

FIG. 4 is a schematic enlarged view of an example of area A1 of FIG. 3. FIG. 5 is a schematic plan view illustrating emission areas and touch electrodes of area A1 of FIG. 3. FIG. 6 is a schematic cross-sectional view taken along line I-I' of FIG. 4. FIG. 7 is a schematic enlarged view of an example of area A2 of FIG. 3. FIG. 8 is a schematic cross-sectional view taken along line II-II' of FIG. 7.

Referring to FIGS. 4 through 8, the display area DA may include pixels. The pixels may include first to third subpixels, and the first to third subpixels may include first to third emission areas EA1 through EA3, respectively. For example, the first emission areas EA1 may emit light of a first color or red light, the second emission areas EA2 may emit light of a second color or green light, and the third emission areas EA3 may emit light of a third color or blue light. However, embodiments are not limited thereto.

The first and third emission areas EA1 and EA3 may be adjacent to each other in the first direction (e.g., X-axis direction) or in the second direction (e.g., Y-axis direction). The first and third emission areas EA1 and EA3 may be disposed in the same row or column. Each of the first emission areas EA1 may be disposed between the third emission areas EA3 arranged in the first direction (e.g., X-axis direction). Each of the first emission areas EA1 may be disposed between the third emission areas EA3 arranged in the second direction (e.g., Y-axis direction). The first emission areas EA1 may be adjacent to the second emission areas EA2 in a diagonal direction between the first direction (e.g., X-axis direction) and the second direction (e.g., Y-axis direction). The third emission areas EA3 may be adjacent to the second emission areas EA2 in the diagonal direction between the first direction (e.g., X-axis direction) and the second direction (e.g., Y-axis direction).

The second emission areas EA2 may be adjacent to each other in the first direction (e.g., X-axis direction) or in the second direction (e.g., Y-axis direction). The second emission areas EA2 may be disposed in the same row or column. The second emission areas EA2 may be adjacent to the first or third emission areas EA1 or EA3 in a diagonal direction between the first direction (e.g., X-axis direction) and the second direction (e.g., Y-axis direction).

One pixel group may include one first emission area EA1, two second emission areas EA2, and one third emission area EA3 to express a white gray level, but the configuration of the pixel group is not limited thereto. The white gray level may be expressed by a combination of light emitted from one first emission area EA1, light emitted from two second emission areas EA2, and light emitted from one third emission area EA3. A first diameter DM1 of each first emission area EA1, a second diameter DM2 of each second emission area EA2, and a third diameter DM3 of each third emission area EA3 may be different from each other. For example, the third diameter DM3 may be greater than the first diameter DM1, and the first diameter DM1 may be greater than the second diameter DM2, but embodiments are not limited thereto. The first diameter DM1 may be substantially the same in the first to third display areas DA1 through DA3. The second diameter DM2 may be substantially the same in the first to third display areas DA1 through DA3. The third diameter DM3 may be substantially the same in the first to third display areas DA1 through DA3.

First to third color filters CF1 through CF3 may be surrounded by a light blocking layer BK. The first to third color filters CF1 through CF3 may overlap the first to third emission areas EA1 through EA3, respectively. A diameter of each first color filter CF1 may be greater than the first diameter DM1 of each first emission area EA1. A diameter of each second color filter CF2 may be greater than the second diameter DM2 of each second emission area EA2. A diameter of each third color filter CF3 may be greater than the third diameter DM3 of each third emission area EA3. Each of the first to third color filters CF1 through CF3 may cover a portion of an upper surface of the light blocking layer BK, but embodiments are not limited thereto.

In the first display area DA1, each of the first emission areas EA1 and the light blocking layer BK may be spaced apart from each other by a first distance D1, e.g., in plan view. In the first display area DA1, each of the second emission areas EA2 and the light blocking layer BK may be spaced apart from each other by the first distance D1, e.g., in plan view. In the first display area DA1, each of the third emission areas EA3 and the light blocking layer BK may be spaced apart from each other by the first distance D1, e.g., in plan view.

In the first display area DA1, the light blocking layer BK between the second emission areas EA2 adjacent to each other in the first direction (e.g., X-axis direction) or the second direction (e.g., Y-axis direction) may have a first width W1, e.g., in plan view. In the first display area DA1, the light blocking layer BK between the first and third emission areas EA1 and EA3 adjacent to each other in the first direction (e.g., X-axis direction) or the second direction (e.g., Y-axis direction) may have a third width W3, e.g., in plan view.

In the second display area DA2, each of the first emission areas EA1 and the light blocking layer BK may be spaced apart from each other by a second distance D2, e.g., in plan view. In the second display area DA2, each of the second emission areas EA2 and the light blocking layer BK may be spaced apart from each other by the second distance D2, e.g., in plan view. In the second display area DA2, each of the third emission areas EA3 and the light blocking layer BK may be spaced apart from each other by the second distance D2, e.g., in plan view.

In the second display area DA2, the light blocking layer BK between the second emission areas EA2 adjacent to each other in the first direction (e.g., X-axis direction) or the second direction (e.g., Y-axis direction) may have a second width W2, e.g., in plan view. In the second display area DA2, the light blocking layer BK between the first and third emission areas EA1 and EA3 adjacent to each other in the first direction (e.g., X-axis direction) or the second direction (e.g., Y-axis direction) may have a fourth width W4, e.g., in plan view.

The second distance D2 of the second display area DA2 may be greater than the first distance D1 of the first display area DA1 (D2>D1). In the first and second display areas DA1 and DA2, a distance between centers of adjacent second emission areas EA2 may be substantially the same (0.5×DM2+D1+W1+D1+0.5×DM2=0.5×DM2+D2+W2+D2+0.5×DM2). Therefore, the first width W1 of the light blocking layer BK of the first display area DA1 may be greater than the second width W2 of the light blocking layer BK of the second display area DA2 (W1>W2).

In the first and second display areas DA1 and DA2, a distance between centers of adjacent first and third emission areas EA1 and EA3 may be substantially the same (0.5×DM1+D1+W3+D1+0.5×DM3=0.5×DM1+D2+W4+0.5×DM3). Therefore, the third width W3 of the light blocking layer BK of the first display area DA1 may be greater than the fourth width W4 of the light blocking layer BK of the second display area DA2 (W3>W4).

In the third display area DA3, each of the first emission areas EA1 and the light blocking layer BK may be spaced apart from each other by the first distance D1, e.g., in plan view. In the third display area DA3, each of the second emission areas EA2 and the light blocking layer BK may be spaced apart from each other by the first distance D1, e.g., in plan view. In the third display area DA3, each of the third emission areas EA3 and the light blocking layer BK may be spaced apart from each other by the first distance D1, e.g., in plan view.

In the third display area DA3, the light blocking layer BK between the second emission areas EA2 adjacent to each other in the first direction (e.g., X-axis direction) or the second direction (e.g., Y-axis direction) may have the first width W1, e.g., in plan view. In the third display area DA3, the light blocking layer BK between the first and third emission areas EA1 and EA3 adjacent to each other in the first direction (e.g., X-axis direction) or the second direction (e.g., Y-axis direction) may have the third width W3, e.g., in plan view.

The second distance D2 of the second display area DA2 may be greater than the first distance D1 of the third display area DA3 (D2>D1). In the second and third display areas DA2 and DA3, the distance between the centers of adjacent second emission areas EA2 may be substantially the same (0.5×DM2+D1+W1+D1+0.5×DM2=0.5×DM2+D2+W2+D2+0.5×DM2). Therefore, the first width W1 of the light blocking layer BK of the third display area DA3 may be greater than the second width W2 of the light blocking layer BK of the second display area DA2 (W1>W2).

In the second and third display areas DA2 and DA3, the distance between the centers of adjacent first and third emission areas EA1 and EA3 may be substantially the same (0.5×DM1+D1+W3+D1+0.5×DM3=0.5×DM1+D2+W4+D2+0.5×DM3). Therefore, the third width W3 of the light blocking layer BK of the third display area DA3 may be greater than the fourth width W4 of the light blocking layer BK of the second display area DA2 (W3>W4).

The first display area DA1 may be driven in the first state and the second state of the display device 10, and the third display area DA3 may not be driven in the first state of the display device 10 and may be driven in the second state of the display device 10. The lifespan of the third display area DA3 may be longer than the lifespan of the first display area DA1. A width (e.g., W2 or W4) of the light blocking layer BK of the second display area DA2 may be smaller than a width (e.g., W1 or W3) of the light blocking layer BK of the first display area DAL. In case that the width (e.g., W2 or W4) of the light blocking layer BK of the second display area DA2 is reduced, areas in which color filters CF are disposed may increase, and thicknesses of the color filters CF may decrease during levelling in an application process (or a deposition process) of the color filters CF, thereby increasing the light efficiency of the color filters CF. Accordingly, the density of the current supplied to pixels of the second display area DA2 may be reduced, and the lifespan of the second display area DA2 may be longer than that of the first display area DAL. Thus, the difference in lifespan between the first and third display areas DA1 and DA3 may be reduced. Since the display device 10 includes the second display area DA2 in which the light blocking layer BK has a relatively small width, the occurrence of an afterimage between the first and third display areas DA1 and DA3 may be delayed, minimized, or prevented.

In FIGS. 6 and 8, the display panel 100 may include a substrate SUB, a thin-film transistor layer TFTL, a light emitting element layer EML, an encapsulation layer TFEL, a touch sensor layer TSL, and a color filter layer CFL.

The substrate SUB may support the display device 10. The substrate SUB may be a base substrate or a base member. The substrate SUB may be a flexible substrate that is bendable, foldable, and rollable. For example, the substrate SUB may include an insulating material, e.g., polymer resin such as polyimide (PI). However, embodiments are not limited thereto. As another example, the substrate SUB may be a rigid substrate including a glass material.

The thin-film transistor layer TFTL may be disposed on the substrate SUB. The thin-film transistor layer TFTL may include a first buffer layer BF1, light blocking layers BML, a second buffer layer BF2, thin-film transistors TFT, a gate insulating layer GI, a first interlayer insulating layer ILD1, capacitor electrodes CPE, a second interlayer insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic layer that may prevent penetration of air or moisture. For example, the first buffer layer BF1 may include inorganic layers stacked alternately.

The light blocking layers BML may be disposed on the first buffer layer BF1. For example, each of the light blocking layers BML may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof. As another example, each of the light blocking layers BML may be an organic layer including a black pigment.

The second buffer layer BF2 may cover the first buffer layer BF1 and the light blocking layers BML. The second buffer layer BF2 may include an inorganic layer that prevents penetration of air or moisture. For example, the second buffer layer BF2 may include inorganic layers stacked alternately.

The thin-film transistors TFT may be disposed on the second buffer layer BF2 and may constitute respective pixel circuits of pixels. For example, each of the thin-film transistors TFT may be a driving transistor or a switching transistor of a pixel circuit. Each of the thin-film transistors TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap each of the light blocking layers BML in a thickness direction. The semiconductor region ACT may overlap the gate electrode GE in the thickness direction and may be insulated from the gate electrode GE by the gate insulating layer GI. The source electrode SE and the drain electrode DE may be prepared by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be disposed on the semiconductor regions ACT, the source electrodes SE, and the drain electrodes DE. For example, the gate insulating layer GI may cover the semiconductor regions ACT, the source electrodes SE, the drain electrodes DE and the second buffer layer BF2 and may insulate the semiconductor regions ACT from the gate electrodes GE. The gate insulating layer GI may include contact holes through which the first connection electrodes CNE1 pass.

The first interlayer insulating layer ILD1 may cover the gate electrodes GE and the gate insulating layer GI. The first interlayer insulating layer ILD1 may include contact holes through which the first connection electrodes CNE1 pass. The contact holes of the first interlayer insulating layer ILD1 may be connected to the contact holes of the gate insulating layer GI and contact holes of the second interlayer insulating layer ILD2.

The capacitor electrodes CPE may be disposed on the first interlayer insulating layer ILD1. The capacitor electrodes CPE may overlap the gate electrodes GE in the thickness direction. The capacitor electrodes CPE and the gate electrodes GE may form capacitances.

The second interlayer insulating layer ILD2 may cover the capacitor electrodes CPE and the first interlayer insulating layer ILD1. The second interlayer insulating layer ILD2 may include the contact holes through which the first connection electrodes CNE1 pass. The contact holes of the second interlayer insulating layer ILD2 may be connected to the contact holes of the first interlayer insulating layer ILD1 and the contact holes of the gate insulating layer GI.

The first connection electrodes CNE1 may be disposed on the second interlayer insulating layer ILD2. The first connection electrodes CNE1 may connect the drain electrodes DE of the thin-film transistors TFT and the second connection electrodes CNE2. The first connection electrodes CNE1 may be inserted into the contact holes provided in the second interlayer insulating layer ILD2, the first interlayer insulating layer ILD1 and the gate insulating layer GI to contact the drain electrodes DE of the thin-film transistors TFT.

The first passivation layer PAS1 may cover the first connection electrodes CNE1 and the second interlayer insulating layer ILD2. The first passivation layer PAS1 may protect the thin-film transistors TFT. The first passivation layer PAS1 may include contact holes through which the second connection electrodes CNE2 pass.

The second connection electrodes CNE2 may be disposed on the first passivation layer PAS1. The second connection electrodes CNE2 may connect the first connection electrodes CNE1 and pixel electrodes AND of light emitting elements LED. The second connection electrodes CNE2 may be inserted into the contact holes provided in the first passivation layer PAS1 to contact the first connection electrodes CNE1.

The second passivation layer PAS2 may cover the second connection electrodes CNE2 and the first passivation layer PAS1. The second passivation layer PAS2 may include contact holes through which the pixel electrodes AND of the light emitting elements LED pass.

The light emitting element layer EML may be disposed on the thin-film transistor layer TFTL. The light emitting element layer EML may include the light emitting elements LED and a pixel defining layer PDL. Each of the light emitting elements LED may include a pixel electrode AND, a light emitting layer EL, and a common electrode CAT.

The pixel electrode AND may be disposed on the second passivation layer PAS2. The pixel electrode AND may overlap one of the first to third emission areas EA1 through EA3 defined by the pixel defining layer PDL. The pixel electrode AND may be connected (e.g., electrically connected) to the drain electrode DE of each thin-film transistor TFT through the first and second connection electrodes CNE1 and CNE2.

The pixel electrode AND may reflect light of a specific wavelength. The pixel electrode AND may reflect infrared light or ultraviolet light. The pixel electrode AND may include an infrared reflective material or an ultraviolet reflective material. For example, the pixel electrode AND may include at least one of silver (Ag), copper (Cu), aluminum (Al), nickel (Ni), and lanthanum (La). As another example, the pixel electrode AND may include a material such as indium tin oxide (ITO), indium zinc oxide (IZO), or indium tin zinc oxide (ITZO). As another example, the pixel electrode AND may include a transparent conductive material layer and a metal layer having high reflectivity or may include one layer including a transparent conductive material and a metal having high reflectivity. The pixel electrode AND may have a stacked structure such as ITO/Ag/ITO/, ITO/Ag/IZO, or ITO/Ag/ITZO/IZO.

The light emitting layer EL may be disposed on the pixel electrode AND. For example, the light emitting layer EL may be an organic light emitting layer made of an organic material. However, embodiments are not limited thereto. In case that the light emitting layer EL is an organic light emitting layer, in case that a thin-film transistor TFT applies a predetermined voltage to the pixel electrode AND of a light emitting element LED and in case that the common electrode CAT of the light emitting element LED receives a voltage or a cathode voltage, holes and electrons may move to the light emitting layer EL respectively through a hole transport layer and an electron transport layer and may combine with each other in the light emitting layer EL to emit light.

The common electrode CAT may be disposed on the light emitting layer EL. For example, the common electrode CAT may be implemented in the form of an electrode common to all pixels without distinction between the pixels. The common electrode CAT may be disposed on the light emitting layers EL in the first to third emission areas EA1 through EA3 and may be disposed on the pixel defining layer PDL in an area other than the first to third emission areas EA1 through EA3. The common electrode CAT may receive a common voltage or a low potential voltage. In case that the pixel electrode AND receives a voltage corresponding to a data voltage and the common electrode CAT receives a low potential voltage, a potential difference may be formed between the pixel electrode AND and the common electrode CAT. Accordingly, the light emitting layer EL may emit light. The common electrode CAT may transmit light of a specific wavelength. The common electrode CAT may transmit infrared light or ultraviolet light.

The pixel defining layer PDL may define the first to third emission areas EA1 through EA3. The pixel defining layer PDL may separate and insulate the respective pixel electrodes AND of the light emitting elements LED.

The encapsulation layer TFEL may be disposed on the common electrode CAT to cover the light emitting elements LED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign substances such as dust.

The touch sensor layer TSL may be disposed on the encapsulation layer TFEL. The touch sensor layer TSL may include a third buffer layer BF3, bridge electrodes BE, a first insulating layer SIL1, touch electrodes TE, and a second insulating layer SIL2.

The third buffer layer BF3 may be disposed on the encapsulation layer TFEL. The third buffer layer BF3 may have insulating and optical functions. The third buffer layer BF3 may include at least one inorganic layer. In another example, the third buffer layer BF3 may be omitted.

The bridge electrodes BE may be disposed on the third buffer layer BF3. Each of the bridge electrodes BE may connect (e.g., electrically connect) the touch electrodes TE spaced apart from each other.

The first insulating layer SIL1 may be disposed on the third buffer layer BF3. The first insulating layer SIL1 may have insulating and optical functions. For example, the first insulating layer SIL1 may be an inorganic layer including at least one of a silicon nitride layer, a silicon oxynitride layer, a silicon oxide layer, a titanium oxide layer, and an aluminum oxide layer. As another example, the first insulating layer SIL1 may include an organic layer.

The touch electrodes TE may be disposed on the first insulating layer SILL. The touch electrodes TE may overlap the pixel defining layer PDL and the light blocking layer BK. The touch electrodes TE may sense a touch of a touch input device such as a user's finger or a pen.

As another example, the bridge electrodes BE may be disposed on the touch electrodes TE to connect (e.g., electrically connect) the touch electrodes TE spaced apart from each other. For example, the touch electrodes TE may be disposed on the third buffer layer BF3, and the bridge electrodes BE may be disposed on the first insulating layer SILL.

The second insulating layer SIL2 may be disposed on the touch electrodes TE and the first insulating layer SILL. The second insulating layer SIL2 may have insulating and optical functions. For example, the second insulating layer SIL2 may be an inorganic layer including at least one of a silicon nitride layer, a silicon oxynitride layer, a silicon oxide layer, a titanium oxide layer, and an aluminum oxide layer. As another example, the second insulating layer SIL2 may include an organic layer.

The color filter layer CFL may be disposed on the touch sensor layer TSL. The color filter layer CFL may include the light blocking layer BK and color filters CF.

The light blocking layer BK may be disposed on the second insulating layer SIL2. The light blocking layer BK may overlap the touch electrodes TE and the pixel defining layer PDL. The light blocking layer BK may surround the first to third emission areas EA1 through EA3 in plan view. The light blocking layer BK may prevent color mixing by preventing intrusion of visible light between the first to third emission areas EA1 through EA3, thereby improving a color gamut of the display device 10. For example, the light blocking layer BK may include an inorganic black pigment or an organic black pigment. The inorganic black pigment may be carbon black, and the organic black pigment may include at least one of lactam black, perylene black, and aniline black. However, embodiments are not limited thereto.

The color filters CF may include the first to third color filters CF1 through CF3. The first to third color filters CF1 through CF3 may be disposed on the second insulating layer SIL2 and the light blocking layer BK to correspond to the first to third emission areas EA1 through EA3, respectively.

The first color filter CF1 may be disposed on the second insulating layer SIL2 in each first emission area EA1. The first color filter CF1 may be surrounded by the light blocking layer BK in plan view. The first color filter CF1 may selectively transmit light of a first color (e.g., red light) and may block or absorb light of a second color (e.g., green light) and light of a third color (e.g., blue light). For example, the first color filter CF1 may be a red color filter and may include a red colorant.

The second color filter CF2 may be disposed on the second insulating layer SIL2 in each second emission area EA2. The second color filter CF2 may be surrounded by the light blocking layer BK in plan view. The second color filter CF2 may selectively transmit light of the second color (e.g., green light) and may block or absorb light of the first color (e.g., red light) and light of the third color (e.g., blue light). For example, the second color filter CF2 may be a green color filter and may include a green colorant.

The third color filter CF3 may be disposed on the second insulating layer SIL2 in each third emission area EA3. The third color filter CF3 may be surrounded by the light blocking layer BK in plan view. The third color filter CF3 may selectively transmit light of the third color (e.g., blue light) and may block or absorb light of the first color (e.g., red light) and light of the second color (e.g., green light). For example, the third color filter CF3 may be a blue color filter and may include a blue colorant.

The first to third color filters CF1 through CF3 may absorb a portion of light coming from outside the display device 10, thereby reducing reflected light due to the external light. The first to third color filters CF1 through CF3 may prevent color distortion due to reflection of external light. Since the color filter layer CFL is directly disposed on the encapsulation layer TFEL, the display device 10 may not require a separate substrate for the color filter layer CFL.

Therefore, a thickness of the display device 10 may be relatively reduced.

The first W1 of the light blocking layer BK of the first display area DA1 may be greater than the second width W2 of the light blocking layer BK of the second display area DA2 (W1>W2). The first width W1 of the light blocking layer BK of the third display area DA3 may be greater than the second width W2 of the light blocking layer BK of the second display area DA2 (W1>W2). Therefore, a first height H1 of each color filter CF of the first or third display area DA1 or DA3 may be greater than a second height H2 of each color filter CF of the second display area DA2. Since a thickness of each color filter CF of the second display area DA2 is relatively small, the light efficiency of each color filter CF of the second display area DA2 may increase.

For example, the light blocking layer BK may include first openings OP1 overlapping the first emission areas EA1, second openings OP2 overlapping the second emission areas EA2, and third openings OP3 overlapping the third emission areas EA3. The first, second, and third openings OP1, OP2, and OP3 of the light blocking layer BK may be spaced apart from each other, and disposed in the first, second, and third display areas DA1, DA2, and DA3. For example, a size (e.g., diameter, width, or area) of each of the first openings OP1 of the light blocking layer BK of the first display area DA1 (or the third display area DA3) may be smaller than a size (e.g., diameter, width, or area) of each of the first openings OP1 of the light blocking layer BK of the second display area DA2. For example, a size (e.g., diameter, width, or area) of each of the second openings OP1 of the light blocking layer BK of the first display area DA1 (or the third display area DA3) may be smaller than a size (e.g., diameter, width, or area) of each of the second openings OP1 of the light blocking layer BK of the second display area DA2. For example, a size (e.g., diameter, width, or area) of each of the third openings OP1 of the light blocking layer BK of the first display area DA1 (or the third display area DA3) may be smaller than a size (e.g., diameter, width, or area) of each of the third openings OP1 of the light blocking layer BK of the second display area DA2. Therefore, the first height H1 of each color filter CF of the first display area DA1 (or the third display area DA3) may be greater than the second height H2 of each color filter CF of the second display area DA2. Since the thickness of each color filter CF of the second display area DA2 is relatively small, the light efficiency of each color filter CF of the second display area DA2 may increase. Accordingly, the density of the current supplied to the pixels of the second display area DA2 may be reduced, and the lifespan of the second display area DA2 may be longer than that of the first display area DAL. Thus, the difference in lifespan between the first and third display areas DA1 and DA3 may be reduced. Since the display device 10 includes the second display area DA2, in which the first, second, and third openings OP1, OP2, and OP3 of the light blocking layer BK have the greater sizes, the occurrence of an afterimage between the first and third display areas DA1 and DA3 may be delayed, minimized, or prevented.

Figure 9:
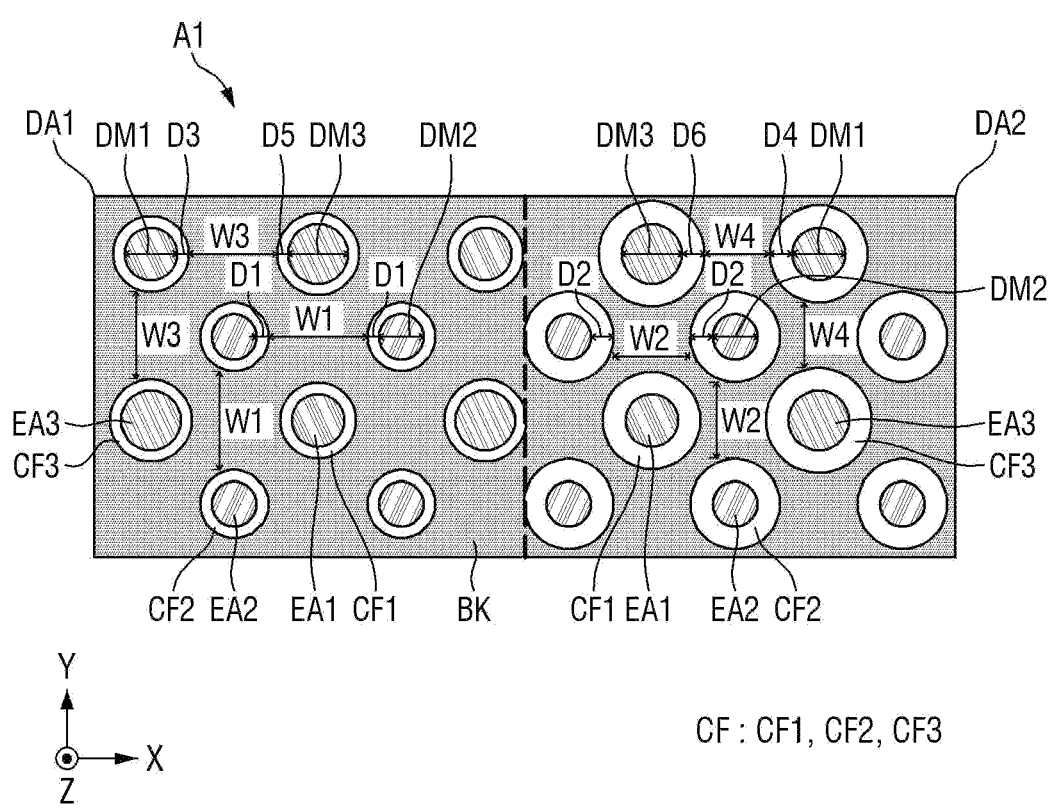
FIG. 9 is a schematic enlarged view of an example of area A1 of FIG. 3.
Figure 10:
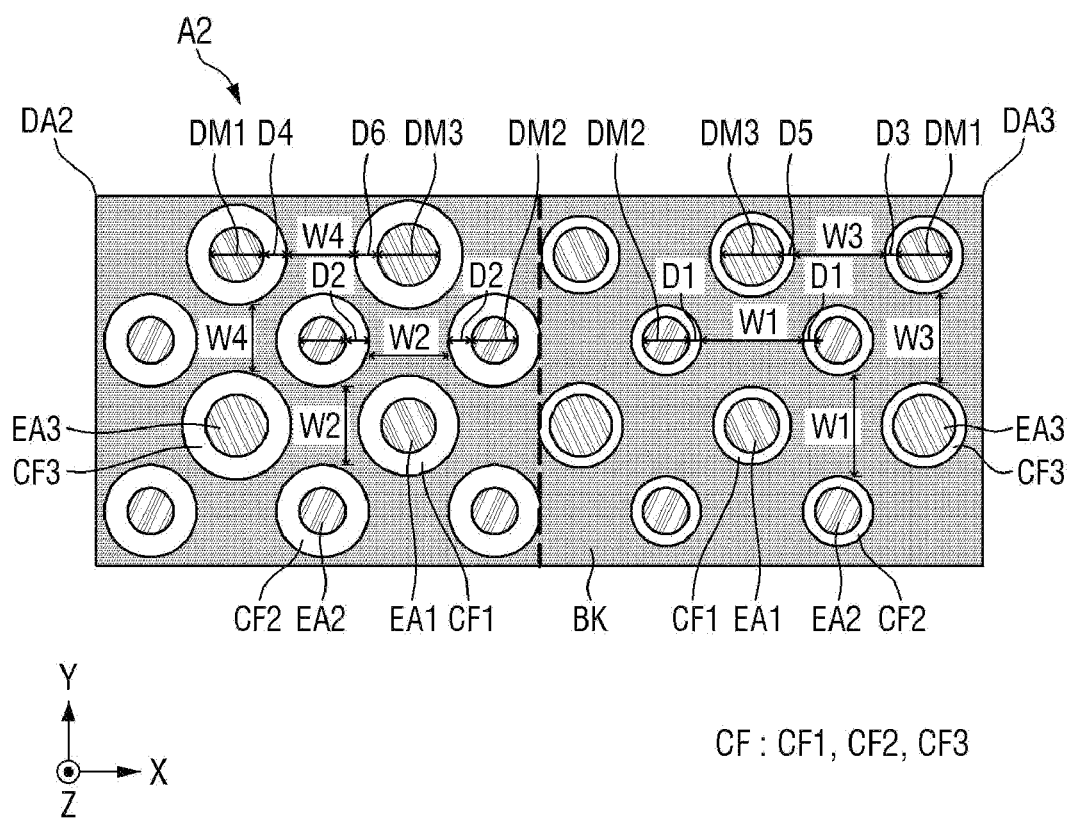
FIG. 10 is a schematic enlarged view of an example of area A2 of FIG. 3.

FIG. 9 is a schematic enlarged view of an example of area A1 of FIG. 3. FIG. 10 is a schematic enlarged view of an example of area A2 of FIG. 3.

Referring to FIGS. 9 and 10, a display area DA may include pixels. The pixels may include first to third subpixels, and the first to third subpixels may include first to third emission areas EA1 through EA3, respectively. A first diameter DM1 of each first emission area EA1, a second diameter DM2 of each second emission area EA2, and a third diameter DM3 of each third emission area EA3 may be different from each other. For example, the third diameter DM3 may be greater than the first diameter DM1, and the first diameter DM1 may be greater than the second diameter DM2. However, embodiments are not limited thereto. The first diameter DM1 may be substantially the same in the first to third display areas DA1 through DA3. The second diameter DM2 may be substantially the same in the first to third display areas DA1 through DA3. The third diameter DM3 may be substantially the same in the first to third display areas DA1 through DA3.

First to third color filters CF1 through CF3 may be surrounded by a light blocking layer BK. The first to third color filters CF1 through CF3 may overlap the first to third emission areas EA1 through EA3, respectively. A diameter of each first color filter CF1 may be greater than the first diameter DM1 of each first emission area EA1. A diameter of each second color filter CF2 may be greater than the second diameter DM2 of each second emission area EA2. A diameter of each third color filter CF3 may be greater than the third diameter DM3 of each third emission area EA3. Each of the first to third color filters CF1 through CF3 may cover a portion of an upper surface of the light blocking layer BK, but embodiments are not limited thereto.

In the first display area DA1, each of the first emission areas EA1 and the light blocking layer BK may be spaced apart from each other by a third distance D3. In the first display area DA1, each of the second emission areas EA2 and the light blocking layer BK may be spaced apart from each other by a first distance D1. In the first display area DA1, each of the third emission areas EA3 and the light blocking layer BK may be spaced apart from each other by a fifth distance D5.

In the first display area DA1, the light blocking layer BK between the second emission areas EA2 adjacent to each other in the first direction (e.g., X-axis direction) or the second direction (e.g., Y-axis direction) may have a first width W1, e.g., in plan view. In the first display area DA1, the light blocking layer BK between the first and third emission areas EA1 and EA3 adjacent to each other in the first direction (e.g., X-axis direction) or the second direction (e.g., Y-axis direction) may have a third width W3, e.g., in plan view.

In the second display area DA2, each of the first emission areas EA1 and the light blocking layer BK may be spaced apart from each other by a fourth distance D4. In the second display area DA2, each of the second emission areas EA2 and the light blocking layer BK may be spaced apart from each other by a second distance D2. In the second display area DA2, each of the third emission areas EA3 and the light blocking layer BK may be spaced apart from each other by a sixth distance D6.

In the second display area DA2, the light blocking layer BK between the second emission areas EA2 adjacent to each other in the first direction (e.g., X-axis direction) or the second direction (e.g., Y-axis direction) may have a second width W2, e.g., in plan view. In the second display area DA2, the light blocking layer BK between the first and third emission areas EA1 and EA3 adjacent to each other in the first direction (e.g., X-axis direction) or the second direction (e.g., Y-axis direction) may have a fourth width W4, e.g., in plan view.

The second distance D2 of the second display area DA2 may be greater than the first distance D1 of the first display area DA1 (D2>D1). In the first and second display areas DA1 and DA2, a distance between centers of adjacent second emission areas EA2 may be substantially the same (0.5×DM2+D1+W1+D1+0.5×DM2=0.5×DM2+D2+W2+D2+0.5×DM2). Therefore, the first width W1 of the light blocking layer BK of the first display area DA1 may be greater than the second width W2 of the light blocking layer BK of the second display area DA2 (W1>W2).

The fourth distance D4 of the second display area DA2 may be greater than the third distance D3 of the first display area DA1 (D4>D3). The sixth distance D6 of the second display area DA2 may be greater than the fifth distance D5 of the first display area DA1 (D6>D5). In the first and second display areas DA1 and DA2, a distance between centers of adjacent first and third emission areas EA1 and EA3 may be substantially the same (0.5×DM1+D3+W3+D5+0.5×DM3=0.5×DM1+D4+W4+D6+0.5×DM3). Therefore, the third width W3 of the light blocking layer BK of the first display area DA1 may be greater than the fourth width W4 of the light blocking layer BK of the second display area DA2 (W3>W4).

In the third display area DA3, each of the first emission areas EA1 and the light blocking layer BK may be spaced apart from each other by the third distance D3. In the third display area DA3, each of the second emission areas EA2 and the light blocking layer BK may be spaced apart from each other by the first distance D1. In the third display area DA3, each of the third emission areas EA3 and the light blocking layer BK may be spaced apart from each other by the fifth distance D5.

In the third display area DA3, the light blocking layer BK between the second emission areas EA2 adjacent to each other in the first direction (e.g., X-axis direction) or the second direction (e.g., Y-axis direction) may have the first width W1, e.g., in plan view. In the third display area DA3, the light blocking layer BK between the first and third emission areas EA1 and EA3 adjacent to each other in the first direction (e.g., X-axis direction) or the second direction (e.g., Y-axis direction) may have the third width W3, e.g., in plan view.

The second distance D2 of the second display area DA2 may be greater than the first distance D1 of the third display area DA3 (D2>D1). In the second and third display areas DA2 and DA3, the distance between the centers of adjacent second emission areas EA2 may be substantially the same (0.5×DM2+D1+W1+D1+0.5×DM2=0.5×DM2+D2+W2+D2+0.5×DM2). Therefore, the first width W1 of the light blocking layer BK of the third display area DA3 may be greater than the second width W2 of the light blocking layer BK of the second display area DA2 (W1>W2).

The fourth distance D4 of the second display area DA2 may be greater than the third distance D3 of the third display area DA3 (D4>D3). The sixth distance D6 of the second display area DA2 may be greater than the fifth distance D5 of the third display area DA3 (D6>D5). In the second and third display areas DA2 and DA3, the distance between the centers of adjacent first and third emission areas EA1 and EA3 may be substantially the same (0.5×DM1+D3+W3+D5+0.5×DM3=0.5×DM1+D4+W4+D6+0.5×DM3). Therefore, the third width W3 of the light blocking layer BK of the third display area DA3 may be greater than the fourth width W4 of the light blocking layer BK of the second display area DA2 (W3>W4).

The first display area DA1 may be driven in the first state and the second state of the display device 10, and the third display area DA3 may not be driven in the first state of the display device 10 and may be driven in the second state of the display device 10. The lifespan of the third display area DA3 may be longer than the lifespan of the first display area DA1. A width (e.g., W2) of the light blocking layer BK of the second display area DA2 may be smaller than a width (e.g., W1) of the light blocking layer BK of the first display area DAL. In case that the width (e.g., W2) of the light blocking layer BK of the second display area DA2 is reduced, areas in which color filters CF are disposed may decrease, and thicknesses of the color filters CF may increase during levelling in an application process (or a deposition process) of the color filters CF, thereby increasing the light efficiency of the color filters CF. Accordingly, the density of the current supplied to pixels of the second display area DA2 may be reduced, and the lifespan of the second display area DA2 may be longer than that of the first display area DAL. Thus, the difference in lifespan between the first and third display areas DA1 and DA3 may be reduced. Since the display device 10 includes the second display area DA2 in which the light blocking layer BK has a relatively small width, the occurrence of an afterimage between the first and third display areas DA1 and DA3 may be delayed, minimized, or prevented.

Figure 11:
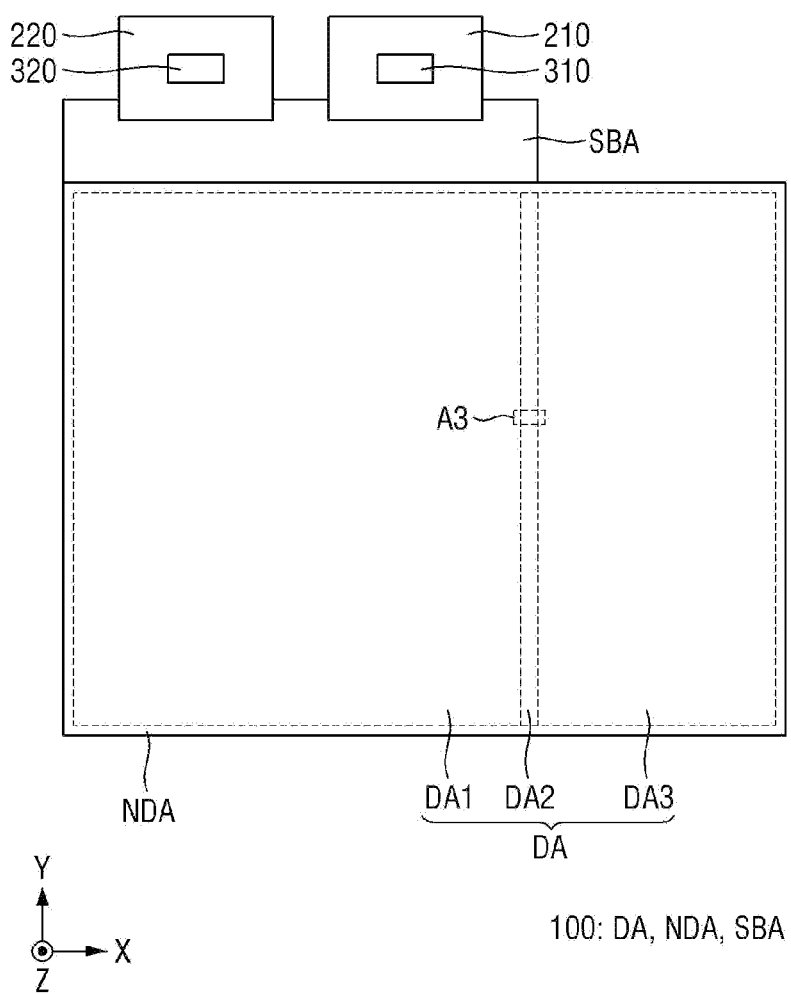
FIG. 11 is a schematic plan view of a display device according to an embodiment.
Figure 12:
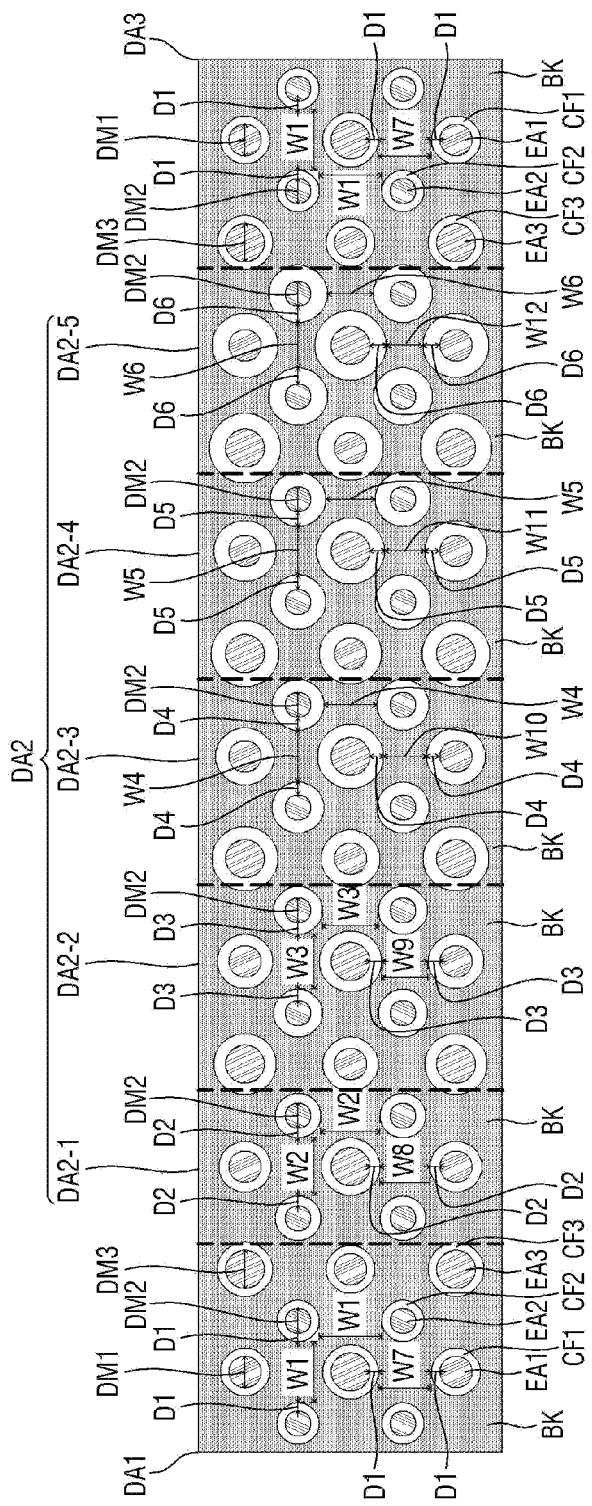
FIG. 12 is a schematic enlarged view of area A3 of FIG. 11.

FIG. 11 is a schematic plan view of a display device 10 according to an embodiment. FIG. 12 is a schematic enlarged view of area A3 of FIG. 11.

Referring to FIGS. 11 and 12, a display area DA may include a first display area DA1, a second display area DA2, and a third display area DA3. The second display area DA2 may include a (2-1)$^{th}$ display area DA2-1, a (2-2)$^{th}$ display area DA2-2, a (2-3)$^{th}$ display area DA2-3, a (2-4)$^{th}$ display area DA2-4, and a (2-5) display area DA2-5 arranged in the first direction (e.g., X-axis direction).

The (2-1)$^{th}$ display area DA2-1 may be disposed on a right side of the first display area DA1. A second distance D2 of the (2-1)$^{th}$ display area DA2-1 may be greater than a first distance D1 of the first display area DA1 (D2>D1). In the first and (2-1)$^{th}$ display areas DA1 and DA2-1, a distance between centers of adjacent second emission areas EA2 may be substantially the same (0.5×DM2+D1+W1+D1+0.5×DM2=0.5×DM2+D2+W2+D2+0.5×DM2). Therefore, a first width W1 of a light blocking layer BK of the first display area DA1 may be greater than a second width W2 of the light blocking layer BK of the (2-1)$^{th}$ display area DA2-1 (W1>W2).

In the first and (2-1)$^{th}$ display areas DA1 and DA2-1, a distance between centers of adjacent first and third emission areas EA1 and EA3 may be substantially the same (0.5×DM1+D1+W7+D1+0.5×DM3=0.5×DM1+D2+W8+D2+0.5×DM3). Therefore, a seventh width W7 of the light blocking layer BK of the first display area DA1 may be greater than an eighth width W8 of the light blocking layer BK of the (2-1)$^{th}$ display area DA2-1 (W7>W8). For example, a height of each color filter CF of the first display area DA1 may be greater than a height of each color filter CF of the (2-1)$^1$ display area DA2-1.

The (2-2)$^1$ display area DA2-2 may be disposed on a right side of the (2-1)$^1$ display area DA2-1. A third distance D3 of the (2-2)$^{th}$ display area DA2-2 may be greater than the second distance D2 of the (2-1)$^{th}$ display area DA2-1 (D3>D2). In the (2-1)$^{th}$ and (2-2)$^{th}$ display areas DA2-1 and DA2-2, the distance between the centers of adjacent second emission areas EA2 may be substantially the same (0.5×DM2+D2+W2+D2+0.5×DM2=0.5×DM2+D3+W3+D3+0.5×DM2). Therefore, the second width W2 of the light blocking layer BK of the (2-1)$^{th}$ display area DA2-1 may be greater than a third width W3 of the light blocking layer BK of the (2-2)$^{th}$ display area DA2-2 (W2>W3).

In the (2-1)$^{th}$ and (2-2)$^{th}$ display areas DA2-1 and DA2-2, the distance between the centers of adjacent first and third emission areas EA1 and EA3 may be substantially the same (0.5×DM1+D2+W8+D2+0.5×DM3=0.5×DM1+D3+W9+D3+0.5×DM3). Therefore, the eighth width W8 of the light blocking layer BK of the (2-1)$^{th}$ display area DA2-1 may be greater than a ninth width W9 of the light blocking layer BK of the (2-2)$^{th}$ display area DA2-2 (W8>W9). For example, the height of each color filter CF of the (2-1)$^{th}$ display area DA2-1 may be greater than the height of each color filter CF of the (2-2)$^1$ display area DA2-2.

The (2-3)$^{th}$ display area DA2-3 may be disposed on a right side of the (2-2)$^{th}$ display area DA2-2. A fourth distance D4 of the (2-3)$^{th}$ display area DA2-3 may be greater than the third distance D3 of the (2-2)$^{th}$ display area DA2-2 (D4>D3). In the (2-2)$^{th}$ and (2-3)$^{th}$ display areas DA2-2 and DA2-3, the distance between the centers of adjacent second emission areas EA2 may be substantially the same (0.5×DM2+D3+W3+D3+0.5×DM2=0.5×DM2+D4+W4+D4+0.5×DM2). Therefore, the third width W3 of the light blocking layer BK of the (2-2)$^{th}$ display area DA2-2 may be greater than the fourth width W4 of the light blocking layer BK of the (2-3)$^{th}$ display area DA2-3 (W3>W4).

In the (2-2)$^{th}$ and (2-3)$^{th}$ display areas DA2-2 and DA2-3, the distance between the centers of adjacent first and third emission areas EA1 and EA3 may be substantially the same (0.5×DM1+D3+W9+D3+0.5×DM3=0.5×DM1+D4+W10+D4+0.5×DM3). Therefore, the ninth width W9 of the light blocking layer BK of the (2-2)$^1$ display area DA2-2 may be greater than a tenth width W10 of the light blocking layer BK of the (2-3)$^{th}$ display area DA2-3 (W9>W10). For example, the height of each color filter CF of the (2-2)$^{th}$ display area DA2-2 may be greater than the height of each color filter CF of the (2-3)$^1$ display area DA2-3.

The (2-4)$^1$ display area DA2-4 may be disposed on a right side of the (2-3)$^1$ display area DA2-3. A fifth distance D5 of the (2-4)$^{th}$ display area DA2-4 may be greater than the fourth distance D4 of the (2-3)$^{th}$ display area DA2-3 (D5>D4). In the (2-3)$^{th}$ and (2-4)$^{th}$ display areas DA2-3 and DA2-4, the distance between the centers of adjacent second emission areas EA2 may be substantially the same (0.5×DM2+D4+W4+D4+0.5×DM2=0.5×DM2+D5+W5+D5+0.5×DM2). Therefore, a fourth width W4 of the light blocking layer BK of the (2-3)$^{th}$ display area DA2-3 may be greater than a fifth width W5 of the light blocking layer BK of the (2-4)$^{th}$ display area DA2-4 (W4>W5).

In the (2-3)$^{th}$ and (2-4)$^{th}$ display areas DA2-3 and DA2-4, the distance between the centers of adjacent first and third emission areas EA1 and EA3 may be substantially the same (0.5×DM1+D4+W10+D4+0.5×DM3=0.5×DM1+D5+W11+D5+0.5×DM3). Therefore, the tenth width W10 of the light blocking layer BK of the (2-3)$^{th}$ display area DA2-3 may be greater than an eleventh width W11 of the light blocking layer BK of the (2-4)$^{th}$ display area DA2-4 (W10>W11). For example, the height of each color filter CF of the (2-3)$^{th}$ display area DA2-3 may be greater than the height of each color filter CF of the (2-4)$^1$ display area DA2-4.

The (2-5)$^{th}$ display area DA2-5 may be disposed on a right side of the (2-4)$^{th}$ display area DA2-4. A sixth distance D6 of the (2-5)$^{th}$ display area DA2-5 may be greater than the fifth distance D5 of the (2-4)$^{th}$ display area DA2-4 (D6>D5). In the (2-4)$^{th}$ and (2-5)$^{th}$ display areas DA2-4 and DA2-5, the distance between the centers of adjacent second emission areas EA2 may be substantially the same (0.5×DM2+D5+W5+D5+0.5×DM2=0.5×DM2+D6+W6+D6+0.5×DM2). Therefore, the fifth width W5 of the light blocking layer BK of the (2-4)$^{th}$ display area DA2-4 may be greater than the sixth width W6 of the light blocking layer BK of the (2-5)$^{th}$ display area DA2-5 (W5>W6).

In the (2-4)$^{th}$ and (2-5)$^{th}$ display areas DA2-4 and DA2-5, the distance between the centers of adjacent first and third emission areas EA1 and EA3 may be substantially the same (0.5×DM1+D5+W11+D5+0.5×DM3=0.5×DM1+D6+W12+D6+0.5×DM3). Therefore, the eleventh width W11 of the light blocking layer BK of the (2-4)$^1$ display area DA2-4 may be greater than a twelfth width W12 of the light blocking layer BK of the (2-5)$^{th}$ display area DA2-5 (W11>W12). For example, the height of each color filter CF of the (2-4)$^{th}$ display area DA2-4 may be greater than the height of each color filter CF of the (2-5)$^1$ display area DA2-5.

The third display area DA3 may be disposed on a right side of the (2-5)$^1$ display area DA2-5. The first distance D1 of the third display area DA3 may be smaller than the sixth distance D6 of the (2-5)$^{th}$ display area DA2-5 (D1<D6). In the (2-5)$^{th}$ and third display areas DA2-5 and DA3, the distance between the centers of adjacent second emission areas EA2 may be substantially the same (0.5×DM2+D6+W6+D6+0.5×DM2=0.5×DM2+D1+W1+D1+0.5×DM2). Therefore, a sixth width W6 of the light blocking layer BK of the (2-5)$^{th}$ display area DA2-5 may be smaller than the first width W1 of the light blocking layer BK of the third display area DA3 (W6<W1).

In the (2-5)$^{th}$ and third display areas DA2-5 and DA3, the distance between the centers of adjacent first and third emission areas EA1 and EA3 may be substantially the same (0.5×DM1+D6+W12+D6+0.5×DM3=0.5×DM1+D1+W7+D1+0.5×DM3). Therefore, the twelfth width W12 of the light blocking layer BK of the (2-5)$^1$ display area DA2-5 may be smaller than a seventh width W7 of the light blocking layer BK of the third display area DA3 (W12<W7). For example, the height of each color filter CF of the third display area DA3 may be greater than the height of each color filter CF of the (2-5)$^1$ display area DA2-5.

The first display area DA1 may be driven in a first state and a second state of the display device 10, and the third display area DA3 may not be driven in the first state of the display device 10 and may be driven in the second state of the display device 10. Therefore, the lifespan of the third display area DA3 may be longer than the lifespan of the first display area DAL. The width (e.g., W2 or W8) of the light blocking layer BK of the (2-1) display area DA2-1 may be smaller than the width (e.g., W1 or W7) of the light blocking layer BK of the first display area DAL. The width (e.g., W3 or W9) of the light blocking layer BK of the (2-2)$^1$ display area DA2-2 may be smaller than the width (e.g., W2 or W8) of the light blocking layer BK of the (2-1)$^{th}$ display area DA2-1. The width (e.g., W4 or W10) of the light blocking layer BK of the (2-3)$^{th}$ display area DA2-3 may be smaller than the width (e.g., W3 or W9) of the light blocking layer BK of the (2-2)$^{th}$ display area DA2-2. The width (e.g., W5 or W11) of the light blocking layer BK of the (2-4)$^{th}$ display area DA2-4 may be smaller than the width (e.g., W4 or W10) of the light blocking layer BK of the (2-3)$^{th}$ display area DA2-3. The width (e.g., W6 or W12) of the light blocking layer BK of the (2-5)$^{th}$ display area DA2-5 may be smaller than the width (e.g., W5 or W11) of the light blocking layer BK of the (2-4)$^{th}$ display area DA2-4.

In case that the width of the light blocking layer BK is gradually reduced in the (2-1)$^1$ display area DA2-1, the (2-2)$^{th}$ display area DA2-2, the (2-3)$^{th}$ display area DA2-3, the (2-4)$^{th}$ display area DA2-4, and the (2-5) display area DA2-5, areas in which the color filters CF are disposed may gradually increase, and thicknesses of the color filters CF may decrease during leveling in an application process (or a deposition process) of the color filters CF, thereby increasing the light efficiency of the color filters CF. The density of the current supplied to pixels of the second display area DA2 may be gradually reduced, and the lifespan of the second display area DA2 may gradually become longer than the lifespan of the first display area DAL. Thus, the difference in lifespan between the first and third display areas DA1 and DA3 may be reduced. Therefore, since the display device 10 includes the (2-1)$^{th}$ display area DA2-1, the (2-2)$^{th}$ display area DA2-2, the (2-3)$^{th}$ display area DA2-3, the (2-4)$^1$ display area DA2-4, and the (2-5)$^1$ display area DA2-5 in which the width of the light blocking layer BK is gradually reduced, the occurrence of an afterimage between the first and third display areas DA1 and DA3 may be delayed, minimized, or prevented.

Figure 13:
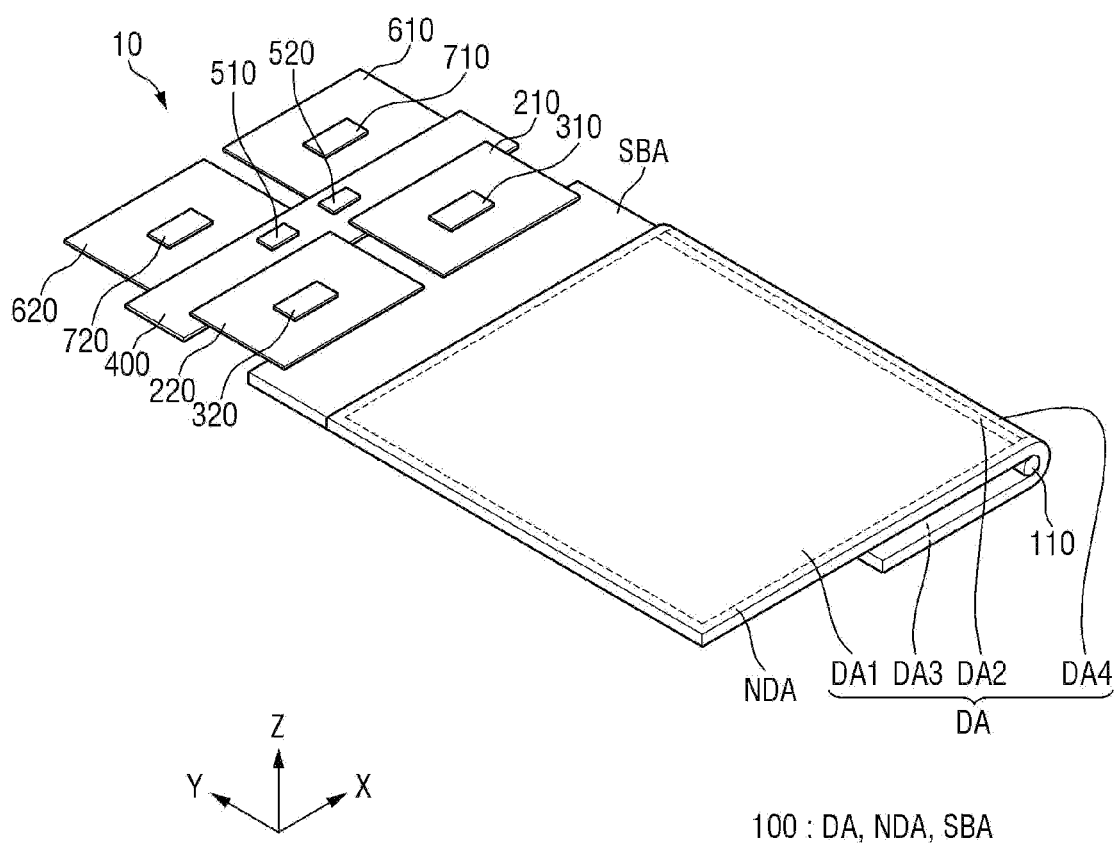
FIG. 13 is a schematic perspective view illustrating a first state of a display device according to an embodiment.
Figure 14:
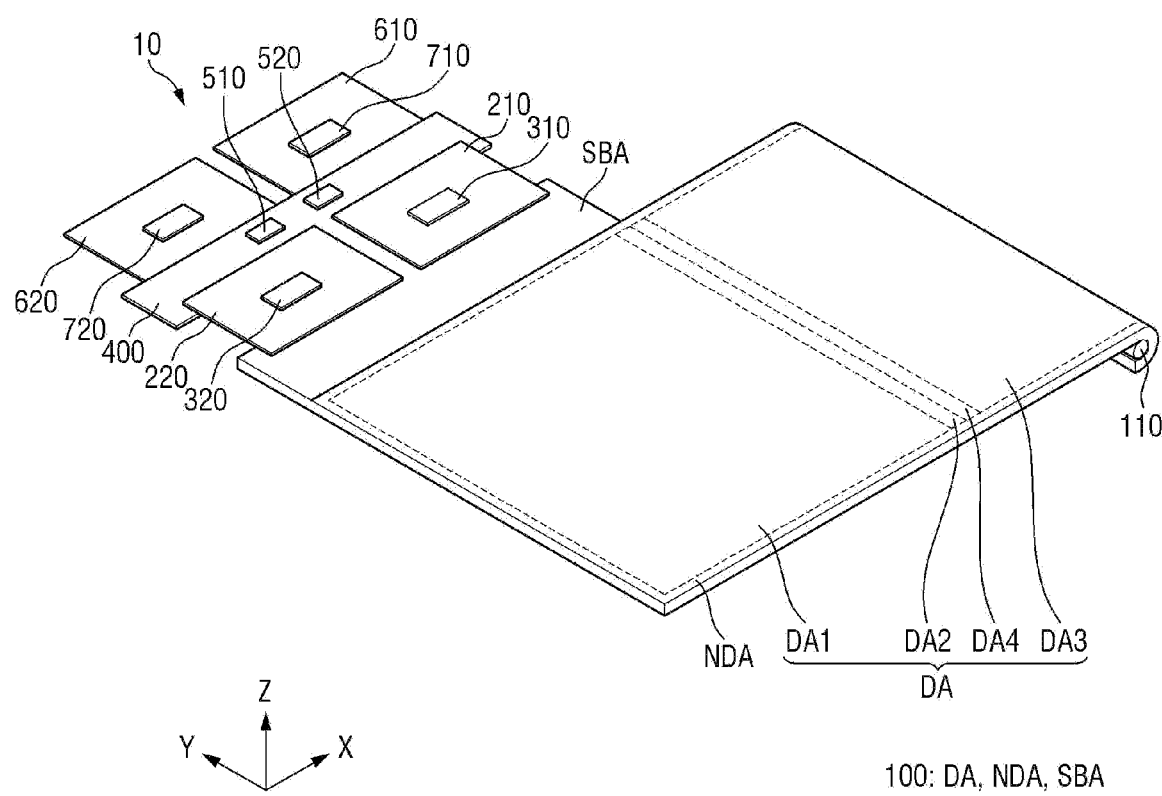
FIG. 14 is a schematic perspective view illustrating a second state of the display device according to an embodiment.
Figure 15:
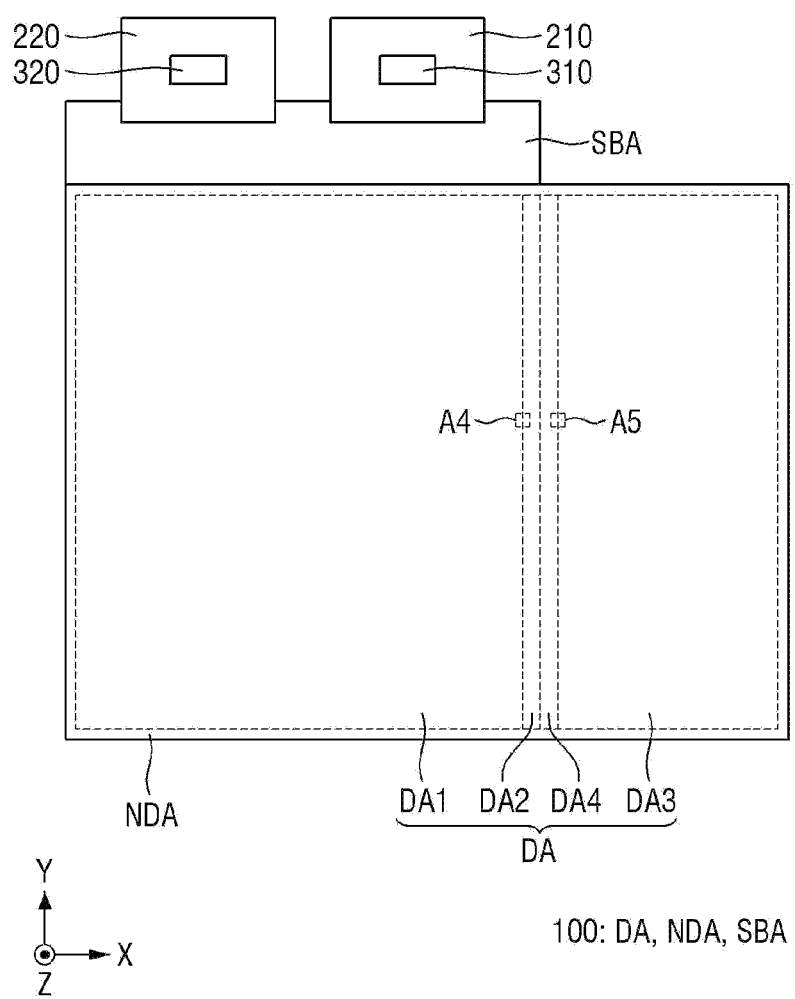
FIG. 15 is a schematic plan view of the display device according to an embodiment.

FIG. 13 is a schematic perspective view illustrating a first state of a display device 10 according to an embodiment. FIG. 14 is a schematic perspective view illustrating a second state of the display device 10 according to an embodiment. FIG. 15 is a schematic plan view of the display device 10 according to an embodiment.

Referring to FIGS. 13 through 15, a display area DA may include a first display area DA1, a second display area DA2, a third display area DA3, and a fourth display area DA4.

The first and second display areas DA1 and DA2 may be a main display unit of a display panel 100. The first and second display areas DA1 and DA2 may be driven in the first state and the second state of the display device 10. The second display area DA2 may be disposed on a right side of the first display area DA1. The second display area DA2 may extend in the first direction (e.g., X-axis direction) from the first display area DAL. The second display area DA2 may be disposed between the first and fourth display areas DA1 and DA4. A length of the second display area DA2 in the first direction (e.g., X-axis direction) may be significantly smaller than a length of the first or third display area DA1 or DA3 in the first direction (e.g., X-axis direction). The first and second display areas DA1 and DA2 may be flat areas that are not curved or bent. However, embodiments are not limited thereto. The first and second display areas DA1 and DA2 may have a quadrilateral planar shape. However, embodiments are not limited thereto.

The fourth display area DA4 may be disposed on a right side of the second display area DA2. The third display area DA3 may be disposed on a right side of the fourth display area DA4. The fourth display area DA4 may extend in the first direction (e.g., X-axis direction) from the second display area DA2 in the second state of the display device 10. The third display area DA3 may extend in the first direction (e.g., X-axis direction) from the fourth display area DA4 in the second state of the display device 10. The third and fourth display areas DA3 and DA4 may be an auxiliary display unit of the display panel 100. The third and fourth display areas DA3 and DA4 may not be driven in the first state of the display device 10 and may be driven in the second state of the display device 10. In the second state of the display device 10, the third and fourth display areas DA3 and DA4 may lie in the same plane as the first and second display areas DA1 and DA2 and may display one image together with the first and second display areas DA1 and DA2. The third and fourth display areas DA3 and DA4 may be curved or bent along a roller 110.

Figure 16:
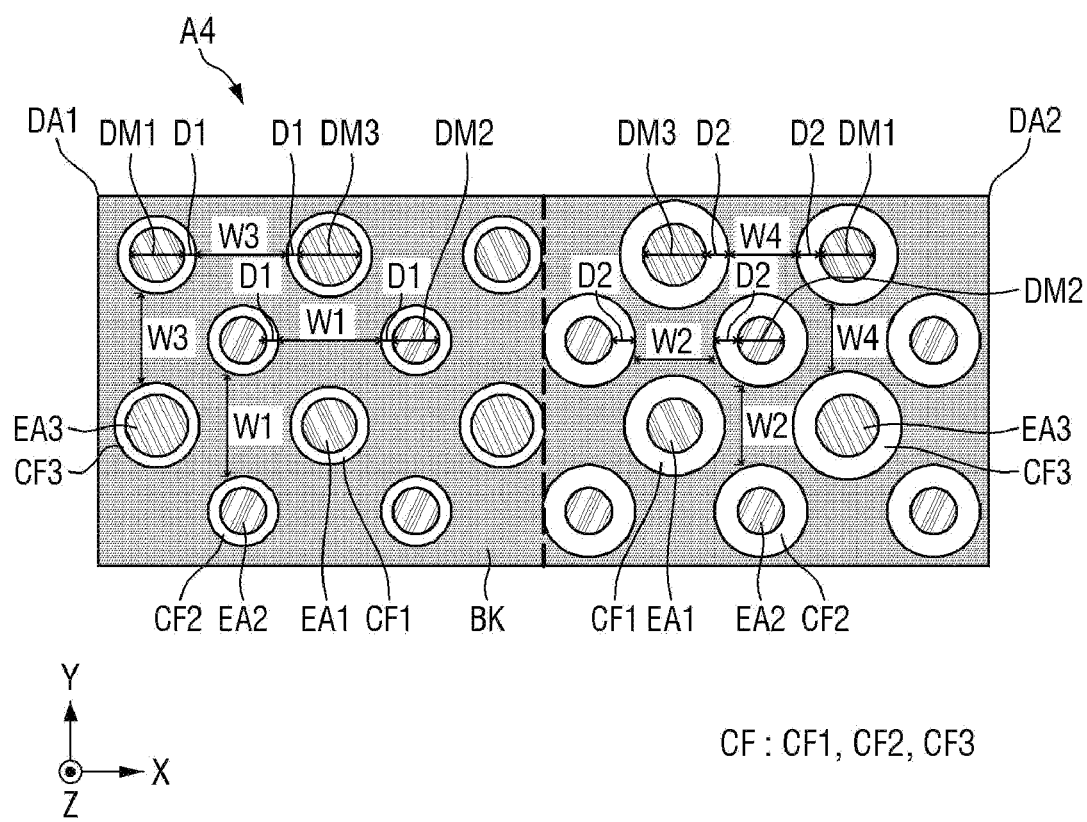
FIG. 16 is a schematic enlarged view of area A4 of FIG. 15.
Figure 17:
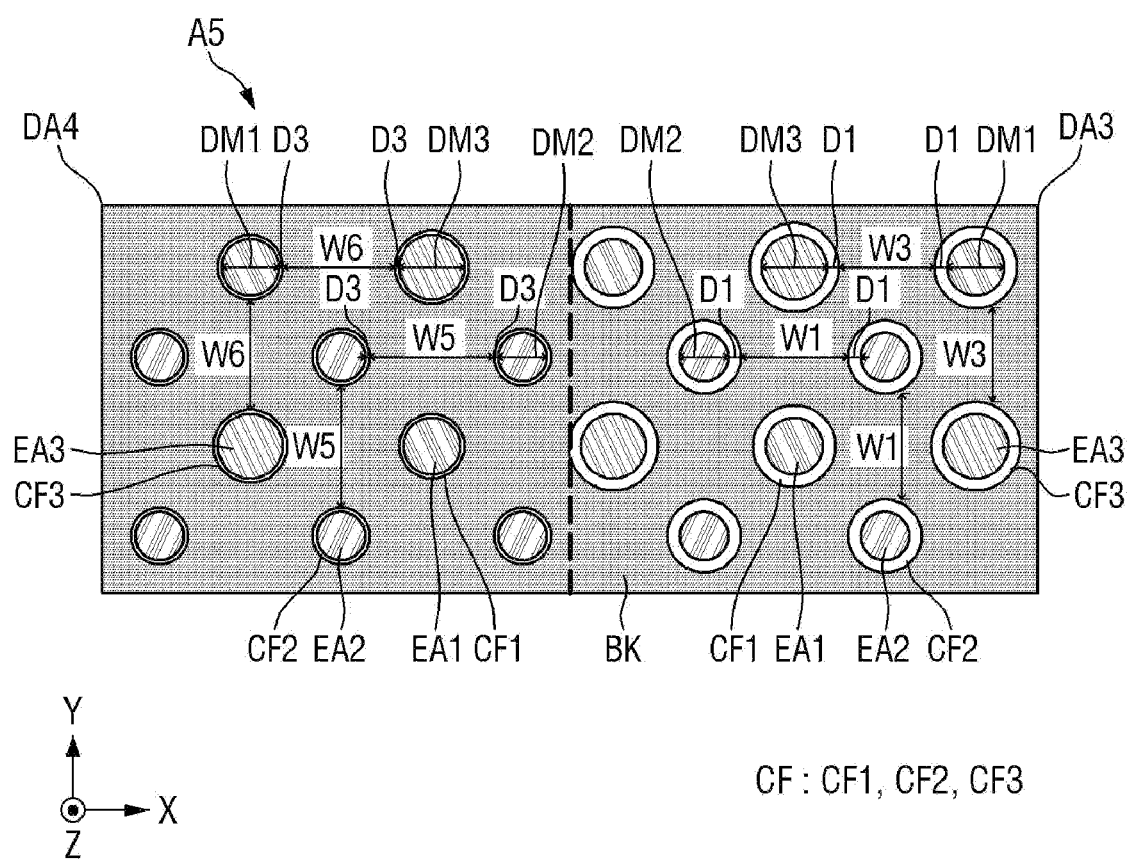
FIG. 17 is a schematic enlarged view of area A5 of FIG. 15.

FIG. 16 is a schematic enlarged view of area A4 of FIG. 15. FIG. 17 is a schematic enlarged view of area A5 of FIG. 15.

Referring to FIGS. 16 and 17, the display area DA may include pixels. The pixels may include first to third subpixels, and the first to third subpixels may include first to third emission areas EA1 through EA3, respectively. A first diameter DM1 of each first emission area EA1, a second diameter DM2 of each second emission area EA2, and a third diameter DM3 of each third emission area EA3 may be different from each other. For example, the third diameter DM3 may be greater than the first diameter DM1, and the first diameter DM1 may be greater than the second diameter DM2. However, embodiments are not limited thereto. The first diameter DM1 may be substantially the same in the first to third display areas DA1 through DA3. The second diameter DM2 may be substantially the same in the first to third display areas DA1 through DA3. The third diameter DM3 may be substantially the same in the first to third display areas DA1 through DA3.

First to third color filters CF1 through CF3 may be surrounded by a light blocking layer BK. The first to third color filters CF1 through CF3 may overlap the first to third emission areas EA1 through EA3, respectively. A diameter of each first color filter CF1 may be greater than the first diameter DM1 of each first emission area EA1. A diameter of each second color filter CF2 may be greater than the second diameter DM2 of each second emission area EA2. A diameter of each third color filter CF3 may be greater than the third diameter DM3 of each third emission area EA3. Each of the first to third color filters CF1 through CF3 may cover a portion of an upper surface of the light blocking layer BK, but embodiments are not limited thereto.

In the first display area DA1, each of the first emission areas EA1 and the light blocking layer BK may be spaced apart from each other by a first distance D1. In the first display area DA1, each of the second emission areas EA2 and the light blocking layer BK may be spaced apart from each other by the first distance D1. In the first display area DA1, each of the third emission areas EA3 and the light blocking layer BK may be spaced apart from each other by the first distance D1.

In the first display area DA1, the light blocking layer BK between the second emission areas EA2 adjacent to each other in the first direction (e.g., X-axis direction) or the second direction (e.g., Y-axis direction) may have a first width W1, e.g., in plan view. In the first display area DA1, the light blocking layer BK between the first and third emission areas EA1 and EA3 adjacent to each other in the first direction (e.g., X-axis direction) or the second direction (e.g., Y-axis direction) may have a third width W3, e.g., in plan view.

In the second display area DA2, each of the first emission areas EA1 and the light blocking layer BK may be spaced apart from each other by a second distance D2. In the second display area DA2, each of the second emission areas EA2 and the light blocking layer BK may be spaced apart from each other by the second distance D2. In the second display area DA2, each of the third emission areas EA3 and the light blocking layer BK may be spaced apart from each other by the second distance D2.

In the second display area DA2, the light blocking layer BK between the second emission areas EA2 adjacent to each other in the first direction (e.g., X-axis direction) or the second direction (e.g., Y-axis direction) may have a second width W2, e.g., in plan view. In the second display area DA2, the light blocking layer BK between the first and third emission areas EA1 and EA3 adjacent to each other in the first direction (e.g., X-axis direction) or the second direction (e.g., Y-axis direction) may have a fourth width W4, e.g., in plan view.

The second distance D2 of the second display area DA2 may be greater than the first distance D1 of the first display area DA1 (D2>D1). In the first and second display areas DA1 and DA2, a distance between centers of adjacent second emission areas EA2 may be substantially the same ($0.5 \times DM2 + D1 + W1 + D1 + 0.5 \times DM2 = 0.5 \times DM2 + D2 + W2 + D2 + 0.5 \times DM2$). Therefore, the first width W1 of the light blocking layer BK of the first display area DA1 may be greater than the second width W2 of the light blocking layer BK of the second display area DA2 (W1>W2).

In the first and second display areas DA1 and DA2, a distance between centers of adjacent first and third emission areas EA1 and EA3 may be substantially the same ($0.5 \times DM1 + D1 + W3 + D1 + 0.5 \times DM3 = 0.5 \times DM1 + D2 + W4 + D2 + 0.5 \times DM3$). Therefore, the third width W3 of the light blocking layer BK of the first display area DA1 may be greater than the fourth width W4 of the light blocking layer BK of the second display area DA2 (W3>W4).

In the third display area DA3, each of the first emission areas EA1 and the light blocking layer BK may be spaced apart from each other by the first distance D1. In the third display area DA3, each of the second emission areas EA2 and the light blocking layer BK may be spaced apart from each other by the first distance D1. In the third display area DA3, each of the third emission areas EA3 and the light blocking layer BK may be spaced apart from each other by the first distance D1.

In the third display area DA3, the light blocking layer BK between the second emission areas EA2 adjacent to each other in the first direction (e.g., X-axis direction) or the second direction (e.g., Y-axis direction) may have the first width W1, e.g., in plan view. In the third display area DA3, the light blocking layer BK between the first and third emission areas EA1 and EA3 adjacent to each other in the first direction (e.g., X-axis direction) or the second direction (e.g., Y-axis direction) may have the third width W3, e.g., in plan view.

In the fourth display area DA4, each of the first emission areas EA1 and the light blocking layer BK may be spaced apart from each other by a third distance D3. In the fourth display area DA4, each of the second emission areas EA2 and the light blocking layer BK may be spaced apart from each other by the third distance D3. In the fourth display area DA4, each of the third emission areas EA3 and the light blocking layer BK may be spaced apart from each other by the third distance D3.

In the fourth display area DA4, the light blocking layer BK between the second emission areas EA2 adjacent to each other in the first direction (e.g., X-axis direction) or the second direction (e.g., Y-axis direction) may have a fifth width W5, e.g., in plan view. In the fourth display area DA4, the light blocking layer BK between the first and third emission areas EA1 and EA3 adjacent to each other in the first direction (e.g., X-axis direction) or the second direction (e.g., Y-axis direction) may have a sixth width W6, e.g., in plan view.

The first distance D1 of the third display area DA3 may be greater than the third distance D3 of the fourth display area DA4 (D1>D3). In the third and fourth display areas DA3 and DA4, the distance between the centers of adjacent second emission areas EA2 may be substantially the same ($0.5 \times DM2 + D1 + W1 + D1 + 0.5 \times DM2 = 0.5 \times DM2 + D3 + W5 + D3 + 0.5 \times DM2$). Therefore, the fifth width W5 of the light blocking layer BK of the fourth display area DA4 may be greater than the first width W1 of the light blocking layer BK of the third display area DA3 (W5>W1).

In the third and fourth display areas DA3 and DA4, the distance between the centers of adjacent first and third emission areas EA1 and EA3 may be substantially the same ($0.5 \times DM1 + D1 + W3 + D1 + 0.5 \times DM3 = 0.5 \times DM1 + D3 + W6 + D3 + 0.5 \times DM3$). Therefore, the sixth width W6 of the light blocking layer BK of the fourth display area DA4 may be greater than the third width W3 of the light blocking layer BK of the third display area DA3 (W6>W3).

The first display area DA1 may be driven in the first state and the second state of the display device 10, and the third display area DA3 may not be driven in the first state of the display device 10 and may be driven in the second state of the display device 10. The lifespan of the third display area DA3 may be longer than the lifespan of the first display area DA1. A width (e.g., W2 or W4) of the light blocking layer BK of the second display area DA2 may be smaller than a width (e.g., W1 or W3) of the light blocking layer BK of the first display area DAL. In case that the width (e.g., W2 or W4) of the light blocking layer BK of the second display area DA2 is smaller than the width (e.g., W1 or W3) of the light blocking layer BK of the first display area DA1, areas in which color filters CF are disposed may increase, and thicknesses of the color filters CF may decrease during levelling in an application process (or a deposition process) of the color filters CF, thereby increasing the light efficiency of the color filters CF. Accordingly, the density of the current supplied to pixels of the second display area DA2 may be reduced, and the lifespan of the second display area DA2 may be longer than that of the first display area DAL. Thus, the difference in lifespan between the first and third display areas DA1 and DA3 may be reduced.

The width (e.g., W1 or W3) of the light blocking layer BK of the third display area DA3 may be smaller than the width (e.g., W5 or W6) of the light blocking layer BK of the fourth display area DA4. In case that the width (e.g., W1 or W3) of the light blocking layer BK of the third display area DA3 is smaller than the width (e.g., W5 or W6) of the light blocking layer BK of the fourth display area DA4, the areas in which the color filters CF are disposed may increase, and the thicknesses of the color filters CF of the third display area DA3 may decrease during leveling in the application process (or a deposition process) of the color filters CF, thereby increasing the light efficiency of the color filters CF. Accordingly, the density of the current supplied to pixels of the third display area DA3 may be reduced, and the lifespan of the third display area DA3 may be longer than that of the fourth display area DA4. Thus, the difference in lifespan between the first and third display areas DA1 and DA3 may be reduced.

Since the display device 10 includes the second display area DA2 in which the width (e.g., W2 or W4) of the light blocking layer BK is relatively smaller than the width (e.g., W1 or W3) of the light blocking layer BK in the first display area DA1, the lifespan of the second display area DA2 adjacent to the first display area DA1, which emits light in the first and second states of the display device 10, may be extended. For example, since the display device 10 includes the fourth display area DA4 in which the width (e.g., W5 or W6) of the light blocking layer BK is relatively greater than the width (e.g., W1 or W3) of the light blocking layer BK in the third display area DA3, the lifespan of the fourth display area DA4 adjacent to the third display area DA3, which is not driven in the first state of the display device 10 and is driven in the second state, may be shortened. Therefore, the display device 10 may delay, minimize, or prevent the appearance of an afterimage between the first and third display areas DA1 and DA3.

In a display device according to embodiments, first and second display areas are driven in first and second states, and a third display area is driven in the second state. Therefore, the lifespan of the third display area may be longer than the lifespan of the first display area. A width of a light blocking layer of the second display area may be smaller than a width of the light blocking layer of the first and third display areas. In case that the width of the light blocking layer of the second display area decreases, thicknesses of color filters may decrease, thereby increasing the light efficiency of the color filters. Accordingly, the density of the current supplied to pixels of the second display area may be reduced, and the lifespan of the second display area may be longer than that of the first display area. Thus, the difference in lifespan between the first and third display areas may be reduced. Since the display device includes the second display area in which the light blocking layer has a relatively small width, it may delay the appearance of an afterimage between the first and third display areas.

However, the effects of the disclosure are not restricted to the one set forth herein. The above and other effects of the disclosure will become more apparent to one of daily skill in the art to which the disclosure pertains by referencing the claims.

What is claimed is:

1. A display device comprising:
    a first display area;
    a second display area adjacent to a side of the first display area;
    a third display area adjacent to a side of the second display area;
    a plurality of emission areas disposed in the first, second, and third display areas to emit light; and
    a light blocking layer surrounding the plurality of emission areas in plan view,
    wherein a width of the light blocking layer between adjacent emission areas in a first direction in each of the first and third display areas is greater than a width of the light blocking layer between adjacent emission areas in the first direction in the second display area.

2. The display device of claim 1, wherein the plurality of emission areas comprise:
    first emission areas that emit light of a first color;
    second emission areas that emit light of a second color different from the first color; and
    third emission areas that emit light of a third color different from the first and second colors.

3. The display device of claim 2, wherein
    the light blocking layer between adjacent second emission areas in the first direction in the first and third display areas has a first width,
    the light blocking layer between adjacent second emission areas in the first direction in the second display area has a second width, and
    the first width is greater than the second width.

4. The display device of claim 2, wherein
    the light blocking layer between the first and third emission areas adjacent to each other in the first direction in the first and third display areas has a third width,
    the light blocking layer between the first and third emission areas adjacent to each other in the first direction in the second display area has a fourth width, and
    the third width is greater than the fourth width.

5. The display device of claim 2, wherein
    each of the first, second, and third emission areas and the light blocking layer are spaced apart from each other by a first distance in the first and third display areas,
    each of the first, second, and third emission areas and the light blocking layer are spaced apart from each other by a second distance in the second display area, and
    the second distance is greater than the first distance.

6. The display device of claim 2, wherein
    each of the second emission areas and the light blocking layer are spaced apart from each other by a first distance in the first and third display areas,
    each of the second emission areas and the light blocking layer are spaced apart from each other by a second distance in the second display area, and
    the second distance is greater than the first distance.

7. The display device of claim 6, wherein
    each of the first emission areas and the light blocking layer are spaced apart from each other by a third distance in the first and third display areas,
    each of the first emission areas and the light blocking layer are spaced apart from each other by a fourth distance in the second display area, and
    the fourth distance is greater than the third distance.

8. The display device of claim 7, wherein
    each of the third emission areas and the light blocking layer are spaced apart from each other by a fifth distance in the first and third display areas,
    each of the third emission areas and the light blocking layer are spaced apart from each other by a sixth distance in the second display area, and
    the sixth distance is greater than the fifth distance.

9. The display device of claim 1, further comprising a plurality of color filters overlapping the plurality of emission areas and surrounded by the light blocking layer.

10. The display device of claim 9, wherein a first height of each of the color filters of the first and third display areas is greater than a second height of each of the color filters of the second display area.

11. The display device of claim 1, wherein the second display area comprises:
   a second-first display area adjacent to a side of the first display area; and
   a second-second display area disposed between the second-first display area and the third display area.

12. The display device of claim 11, wherein a width of the light blocking layer between emission areas adjacent to each other in the first direction in each of the first and third display areas is greater than a width of the light blocking layer between emission areas adjacent to each other in the first direction in the second-first display area.

13. The display device of claim 12, further comprising a plurality of color filters overlapping the plurality of emission areas and surrounded by the light blocking layer,
   wherein a height of each of the color filters of the first and third display areas is greater than a height of each of the color filters of the second-first display area.

14. The display device of claim 12, wherein the width of the light blocking layer between adjacent emission areas in the first direction in the second-first display area is greater than a width of the light blocking layer between adjacent emission areas in the first direction in the second-second display area.

15. The display device of claim 14, further comprising a plurality of color filters overlapping the plurality of emission areas and surrounded by the light blocking layer,
   wherein a height of each of the color filters of the second-first display area is greater than a height of each of the color filters of the second-second display area.

16. The display device of claim 1, wherein
   the third display area overlaps the first and second display areas in a first state,
   the first, second, and third display areas form a same plane in a second state,
   the first and second display areas are driven in the first state and the second state, and
   the third display area is driven in the second state.

17. A display device comprising:
   a first display area;
   a second display area adjacent to a side of the first display area;
   a third display area adjacent to a side of the second display area;
   a fourth display area disposed between the second and third display areas;
   a plurality of emission areas disposed in the first, second, third, and fourth display areas to emit light; and
   a light blocking layer surrounding the plurality of emission areas in plan view, wherein
   the light blocking layer between adjacent emission areas in a first direction in the first and third display areas has a first width,
   the light blocking layer between adjacent emission areas in the first direction in the second display area has a second width,
   the light blocking layer between adjacent emission areas in the first direction in the fourth display area has a third width,
   the first width is greater than the second width, and
   the third width is greater than the first width.

18. The display device of claim 17, wherein
   the plurality of emission areas comprise:
      first emission areas that emit light of a first color;
      second emission areas that emit light of a second color different from the first color; and
      third emission areas that emit light of a third color different from the first and second colors,
   each of the first, second, and third emission areas and the light blocking layer are spaced apart from each other by a first distance in the first display area,
   each of the first, second, and third emission areas and the light blocking layer are spaced apart from each other by a second distance in the second display area, and
   the second distance is greater than the first distance.

19. The display device of claim 18, wherein
   each of the first, second, and third emission areas and the light blocking layer are spaced apart from each other by the first distance in the first and third display areas,
   each of the first, second, and third emission areas and the light blocking layer are spaced apart from each other by a third distance in the fourth display area, and
   the first distance is greater than the third distance.

20. A display device comprising:
   a first display area;
   a second display area adjacent to a side of the first display area;
   a third display area adjacent to a side of the second display area;
   a roller that selectively moves the third display area by sliding the third display area;
   a plurality of emission areas disposed in the first, second, and third display areas to emit light; and
   a light blocking layer surrounding the plurality of emission areas in plan view, wherein
   the third display area is moved in a first direction in a first state by the roller so that the third display area overlaps the first and second display areas,
   the third display area is moved in a second direction opposite to the first direction in a second state by the roller so that the first, second, and third display areas form a same plane, and
   a width of the light blocking layer between adjacent emission areas in the first direction in each of the first and third display areas is greater than a width of the light blocking layer between adjacent emission areas in the first direction in the second display area.

* * * * *